United States Patent [19]

Ohsaki et al.

[11] Patent Number: 5,477,492
[45] Date of Patent: Dec. 19, 1995

[54] MEMORY DEVICE TO DETECT AND COMPENSATE FOR DEFECTIVE MEMORY CELLS

[75] Inventors: Akitoshi Ohsaki; Akira Yamada, both of Itami, Japan

[73] Assignee: Mitsubishi Denki Kabushiki Kaisha, Tokyo, Japan

[21] Appl. No.: 216,388

[22] Filed: Mar. 23, 1994

[30] Foreign Application Priority Data

Mar. 24, 1993 [JP] Japan .................................... 5-065146

[51] Int. Cl.$^6$ ................................................. G11C 7/00
[52] U.S. Cl. ........................ 365/200; 371/10.2; 371/21.2; 371/21.1
[58] Field of Search .................... 371/10.2, 21.2, 371/21.1; 365/200

[56] References Cited

U.S. PATENT DOCUMENTS 4,667,330  5/1987  Kumagi .................... 371/21.1

FOREIGN PATENT DOCUMENTS 3-162798  7/1991  Japan.

Primary Examiner—David C. Nelms
Assistant Examiner—F. Niranjan
Attorney, Agent, or Firm—Lowe, Price, LeBlanc & Becker

[57] ABSTRACT

A memory device includes a redundant data-storage section as a spare for a normal data-storage section so that redundant data-holding circuitry repairs a defective area in normal data-holding circuitry. Data to be written is temporarily stored into a data holding section, and the data thus stored is written into the normal data-storage section and then it is read out immediately after the write operation. If the readout data is different from the initially written data, the destination of the write operation is switched to the redundant data-storage section so that the data held in the data holding section is written into the redundant data-storage section. If there is no discrepancy between these data, the destination of the write operation is then switched to the normal data-storage section so that the data held in the data holding section is written into the normal data-storage section.

5 Claims, 38 Drawing Sheets

5,477,492

MEMORY DEVICE TO DETECT AND COMPENSATE FOR DEFECTIVE MEMORY CELLS

BACKGROUND OF THE INVENTION

1. Field of the Invention

The present invention relates to a memory device designed to allow repair of defective areas in a memory section into which data are written.

2. Description of Related Art

With increasing functionality and performance of information processing systems, there has been increasing a demand for larger memory capacities and smaller dimensions of memory devices. To meet such a demand, miniature processing techniques for memory devices have been improved to increase the memory capacity per unit area. However, advances in manufacturing technology have not scaled with advances in memory device miniaturization, and the fabrication yields of such memories are lower than those of lower-capacity memories.

To increase the fabrication yields of such memories, there have been proposed techniques wherein redundant data-holding circuitry (hereinafter referred to as the redundant memory section) is built into the memory in addition to the normal data-holding circuitry (hereinafter referred to as the normal memory section) so that the redundant memory section is switched in to replace defective areas in the normal memory section.

A variety of methods have already been proposed for switching from the normal memory section to the redundant memory section during the manufacturing process of a memory device, one method involving blowing fuses provided in the memory and another involving opening interconnections by laser. There have also been proposed methods for switching from the normal memory section to the redundant memory section after the manufacture is completed; one such method has been proposed by the present applicant in Japanese Patent Application Laid-Open No. 3-162798 (1991) wherein a nonvolatile memory section for storing information for identifying a defective area in the normal memory section is built into the memory device and access is made either to the normal memory sect, ion or to the redundant memory section depending on the value of the information.

The present applicant has also proposed in U.S. Ser. No. 07/883,582 a method of switching from the normal memory section to the redundant memory section wherein a self-test of the entire memory device is performed by inputting a specific signal and the switching is made in accordance with the result of the test.

However, with the methods of switching from the normal memory section to the redundant memory section by blowing fuses provided in the memory or by opening interconnections by laser, as mentioned above, provisions must be made to detect a defective area in the normal memory section during the manufacture of the memory device. This requires a special test equipment and a processing equipment as well as extra labor for carrying out the purpose.

On the other hand, with the method proposed in Japanese Patent Application Laid-Open No. 3-162798 (1991), information for identifying a defective area in the normal memory section is stored in the nonvolatile memory section, and by referring to this information, the destination of a write operation is switched either to the normal memory section or to the redundant memory section; therefore, a read operation needs to be performed to read out data from the nonvolatile memory section. However, the reading speed of nonvolatile memory means is generally slower than that of volatile memory means, leading to the problem that the switching of the write destination cannot be performed at high speed.

Furthermore, with the method proposed in U.S. Ser. No. 07/883,582, the entire normal memory section is first checked for a defective area by inputting a specific signal, and then, the destination of a write operation is switched either to the normal memory section or to the redundant memory section depending on the result; this requires that the check for a defective area be performed at the beginning of the memory device operation. The problem here is that the memory device cannot perform a normal write operation during this period, thus delaying the initiation of data processing in the data processing section.

SUMMARY OF THE INVENTION

An object of the invention is to provide a memory device that does not require the use of special test equipment or special processing equipment when switching the destination of a write operation between the normal memory section and the redundant memory section.

Another object of the invention is to provide a memory device into which data can be written at high speed despite the presence of a defective write area.

A further object of the invention is to provide a memory device capable of handing a failure during a write operation.

The present invention is concerned with a memory device which contains data writing means, data holding means, and data reading means, and in which an area designated within the data holding means for access via the data writing means and data reading means is specified by a prescribed signal; the memory device comprises write-data holding means for temporarily holding data to be written into the data holding means, error detecting means for detecting a discrepancy between the data obtained by the operation of the data reading means and the data initially written by the data writing means, defective-area indicating means for indicating a defective area detected within the data holding means by the error detecting means, alternate data-holding means having a function equivalent to that of the data holding means, alternate data-writing means for writing data into the alternate data-holding means, alternate data-reading means for reading data from the alternate data-holding means, and operation switching means for switching the destination of a write operation either to the data holding means or to the alternate data-holding means by the data error detecting means and defective-area indicating means.

According to the memory device of the present invention, data to be written into the data holding means is temporarily held in the write-data holding means. The data thus held is then written into the data holding means, and the data just written is read out by the data reading means. If a discrepancy is detected between the readout data and the written data, the destination of the write operation is switched by the operation switching means to the alternate data-holding means, and the data held in the write-data holding means is written into the alternate data-holding means. If no discrepancy is detected between the data read out immediately after writing and the data initially written, the destination of the write operation is switched by the operation switching means to the data holding means, and the data held in the write-data holding means is written into the data holding means.

This procedure eliminates the need to check or process the data holding means to effect the switching between the data holding means and the alternate data-holding means during the manufacturing process.

According to another memory device of the invention in which a plurality of data are successively written, data to be written into the data holding means is temporarily stored in the write-data holding means during the first-half period of the successive write operation. Then, a prescribed value is written into the data holding means, and the data just written is read out by the data reading means. If a discrepancy is detected between the readout data and the initially written data, then the destination of the write operation is switched by the operation switching means to the alternate data-holding means. In the second-half period of the successive write operation, the data held in the write-data holding means and the data to be written into the data holding means are both written into the alternate data-holding means. On the other hand, if no discrepancy is detected between the data read out immediately after writing and the data initially written, the destination of the write operation is switched by the operation switching means to the data holding means, so that the data held in the write-data holding means and the data to be written into the data holding means are both written into the data holding means.

This procedure eliminates the need to check and process the data holding means to effect the switching between the data holding means and the alternate data-holding means during the manufacturing process. Furthermore, data can be written at high speed.

The above and further objects and features of the invention will more fully be apparent from the following detailed description with accompanying drawings.

DESCRIPTION OF THE PREFERRED EMBODIMENTS

Preferred embodiments of the present invention will be described in detail below with reference to the accompanying drawings.

1st Embodiment

Figure 1:
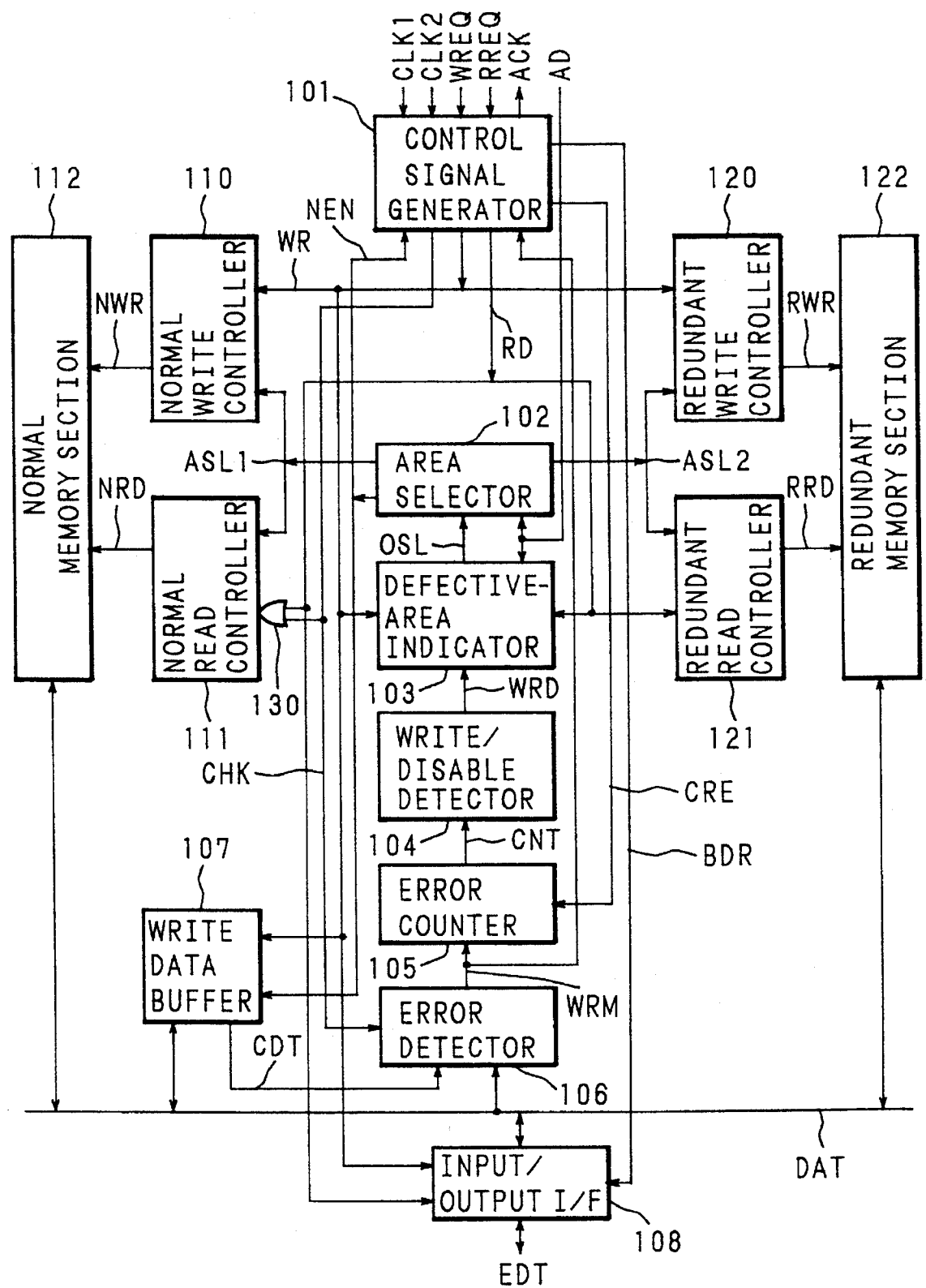
FIG. 1 is a block diagram showing a configuration of a memory device according to a first embodiment of the present invention.

FIG. 1 is a block diagram showing a configuration of a memory device according to a first embodiment of the invention. Clock signals CLK1 and CLK2, a write request signal WREQ, a read request signal RREQ, and an address signal AD are supplied from the outside. A request acknowledge signal ACK is output to the outside. External data EDT is transferred to and from the outside. The externally generated clock signals CLK1 and CLK2, write request signal WREQ, and read request signal RREQ are inputted to a control signal generator 101. A write signal WR output from the control signal generator 101 is supplied to a normal write controller 110, a redundant write controller 120, a defective-area indicator 103, a write data buffer 107, and an input/output I/F (input/output interface) 108. A read signal RD output from the control signal generator 101 is supplied to one input terminal of an OR circuit 130 and also to a redundant read controller 121, as well as to the defective-area indicator 103 and the input/output I/F 108. A check signal CHK output from the control signal generator 101 is supplied to the other input of the OR circuit 130 and also to an error detector 106. A counter reset signal CRE output from the control signal generator 101 is supplied to an error counter 105. An input/output direction indicating signal BDR output, from the control signal generator 101 is supplied to the input/output I/F 108.

The externally supplied address signal AD is inputted to an area selector 102 as well as to the defective-area indicator 103. An area selection signal ASL1 output from the area selector 102 is supplied to a normal read controller 111 as well as to the normal write controller 110. An area selection signal ASL2 output from the area selector 102 is supplied to the redundant read controller 121 as well as to the redundant write controller 120. A normal-circuit enable signal NEN output from the area selector 102 is supplied to the control signal generator 101 and also to the write data buffer 107.

A normal write control signal NWR output from the normal write controller 110 is supplied to a normal memory section 112. The output of the OR circuit 130 is supplied as an input to the normal read controller 111. A normal read control signal NRD output from the normal read controller 111 is supplied to the normal memory section 112. A redundant write control signal RWR output from the redundant write controller 120 is supplied to a redundant memory section 122. A redundant read control signal RRD output from the redundant read controller 121 is supplied to the redundant memory section 122. A data check signal CDT output from the write data buffer 107 is supplied to the error detect, or 106. An error detection signal WRM output from the error detector 106 is supplied to the control signal generator 101 as well as to the error counter 105. An error count signal CNT output from the error counter 105 is supplied to a write-disable detector 104. A write-disable detection signal WRD output from the write-disable detector 104 is supplied to the defective-area indicator 103. An operation destination select signal OSL output from the defective-area indicator 103 is supplied to the area selector 102.

Data DAT is input and output with respect to the input/output I/F 108, the normal memory section 112, the redundant memory section 122, and the write data buffer 107. The data DAT is also input to the error detector 106. The external data EDT is transferred between the input/output I/F 108 and an external circuit, not shown. The request acknowledge signal ACK is output from the control signal generator 101 and directed to an external circuit not shown.

Figure 2:
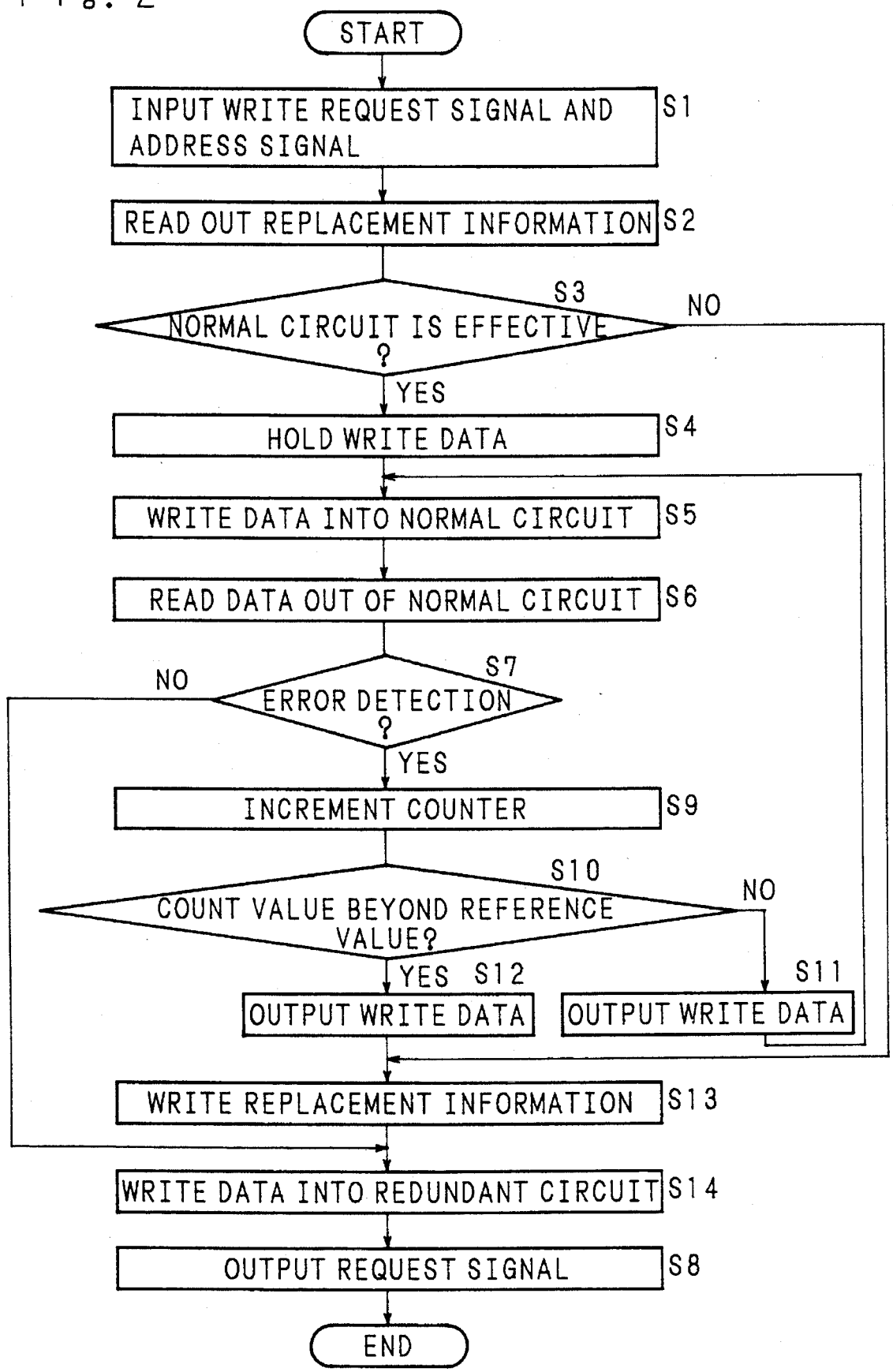
FIG. 2 is a flowchart for a write operation.
Figure 3:
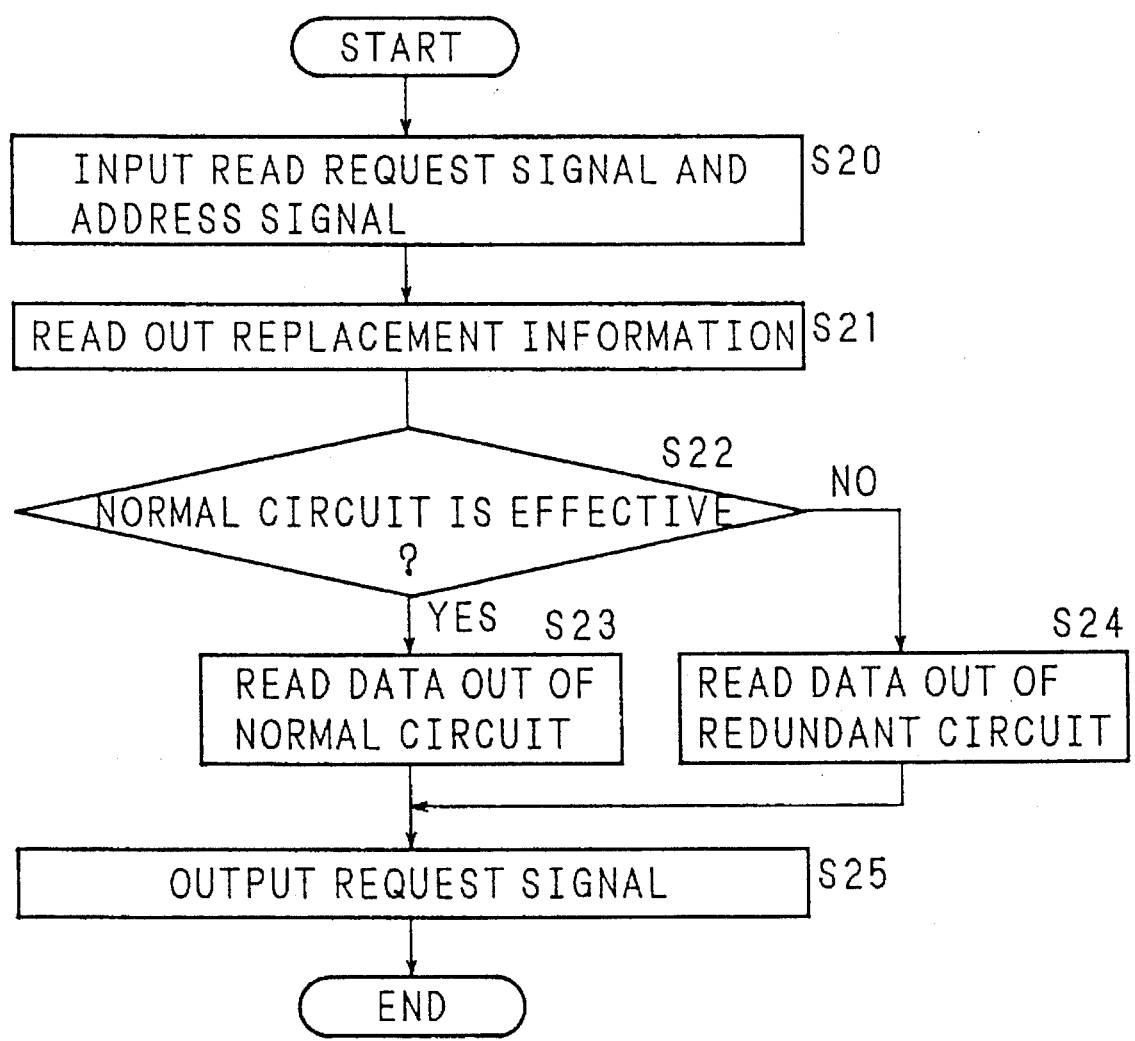
FIG. 3 is a flowchart for a read operation.

The operation of the thus configured memory device will be described below with reference to the flowcharts shown in FIGS. 2 and 3. FIG. 2 shows the flowchart for a write operation, and FIG. 3 shows the flowchart for a read operation.

First, the write operation will be described. The write request signal WREQ is enabled (hereinafter described as "asserted"), and at the same time, the address signal AD is inputted (S1), in response to which the defective-area indicator 103 outputs the operation destination select signal OSL which carries information on the replacement of the normal memory section 112 (S2). At this time, since the input/output direction indicating signal BDR is asserted, the external data EDT is inputted through the output I/F 108 as data DAT. The operation destination select signal OSL is examined to determine whether or not the write operation destination specified is the normal memory section 112 (S3). If it is determined that the destination is the normal memory section 112, first the value of the data DAT, i.e. the write data, is latched into the write data buffer 107 (S4). At the same time, the same write data, i.e. the same value of the data DAT, is written into a designated area within the normal memory section 112 as specified by the address signal AD (S5). Next, the data written in the normal memory section 112 is read out (S6), and the readout data is compared by the error detector 106 with the value held in the write data buffer 107 for detection of errors. Then, a decision is made as to whether any errors have been detected (S7), and if it is decided that no errors have been detected, the request acknowledge signal ACK is outputted (S8), to complete the write operation.

On the other hand, if it is decided that an error has been detected (S7), the count value of the error counter 105 is incremented (S9), and then, a decision is made as to whether the counter value has exceeded a predetermined reference value, for example "2" (S10). If it is decided that the counter value is not more than the reference value, then the value held in the write data buffer 107 is outputted as write data DAT (S11), and the operations from step (S5) through step (S10) are repeated. During this repeating period, since the input/output direction indicating signal BDR is disabled (hereinafter described as "negated"), the external data EDT is not inputted as data DAT. Next, when it is decided that the counter value of the error counter 105 has exceeded the reference value, the value held in the write data buffer 107 is outputted as write data DAT (S12), and replacement information for switching the write destination to the redundant memory section 122 is written into the defective-area indicator 103 (S13). The data DAT output from the write data buffer 107 is then written into a write area designated within the redundant memory section 122 by the operation destination select signal OSL output from the defective-area indicator 103 (S14).

Then, the request acknowledge signal ACK is outputted (S8), to complete the write operation. In the above process, if decision is made in step S3 that the write destination area indicated by the operation destination select signal OSL is the redundant memory section 122, not the normal memory section 112, the data DAT is written into a write area designated within the redundant memory section 122 by the defective-area indicator 103 (S14), and then, the request acknowledge signal ACK is output (S8), to complete the write operation.

Next, the read operation will be described. First, the read request signal RREQ is asserted, and at the same time, the address signal AD is inputted (S20), in response to which the defective-area indicator 103 outputs the operation destination select signal OSL which carries information on the replacement of the normal memory section 112 (S21). Next, a decision is made as to whether or not the operation destination area indicated by the operation destination select signal OSL is the normal memory section 112 (S22). If it is decided that the destination is the normal memory section 112, the value held in a write area designated within the normal memory section 112 by the address signal AD is outputted as data DAT (S23). On the other hand, if it is decided that the destination is not the normal memory section 112, the value held in a write area designated within the redundant memory section 122 by the address signal AD is outputted as the data DAT (S24). After the data DAT is outputted in this manner, the request acknowledge signal ACK is outputted (S25) to complete the read operation. In the read operation, since the input/output direction indicating signal BDR is negated, the data DAT is outputted as the external data EDT.

As described, in the memory device of this embodiment, the write data is temporarily held in the write data buffer. If a discrepancy is detected between the data just written and the data read out immediately after the writing operation, thus indicating the occurrence of an error, the write destination of the data is switched to the redundant memory section; if no discrepancy is detected, the destination is switched to the normal memory section. The data held in the write data buffer is then written into the selected memory section. This configuration, therefore, does not require any special test equipment or processing equipment for switching the destination between the normal memory section and the redundant memory section, allowing the initiation of a normal write operation upon starting the memory operation, and yet ensures accurate data write. Furthermore, since the memory is checked at the time of data write, proper action can be taken in case of a failure during a write operation. Moreover, since each data write is immediately followed by data read, a failure analysis can be easily done to determine whether or not the failure detected is attributable to the data storing operation.

Next, the configuration and operation of each part shown in FIG. 1 will be described below.

Figure 4:
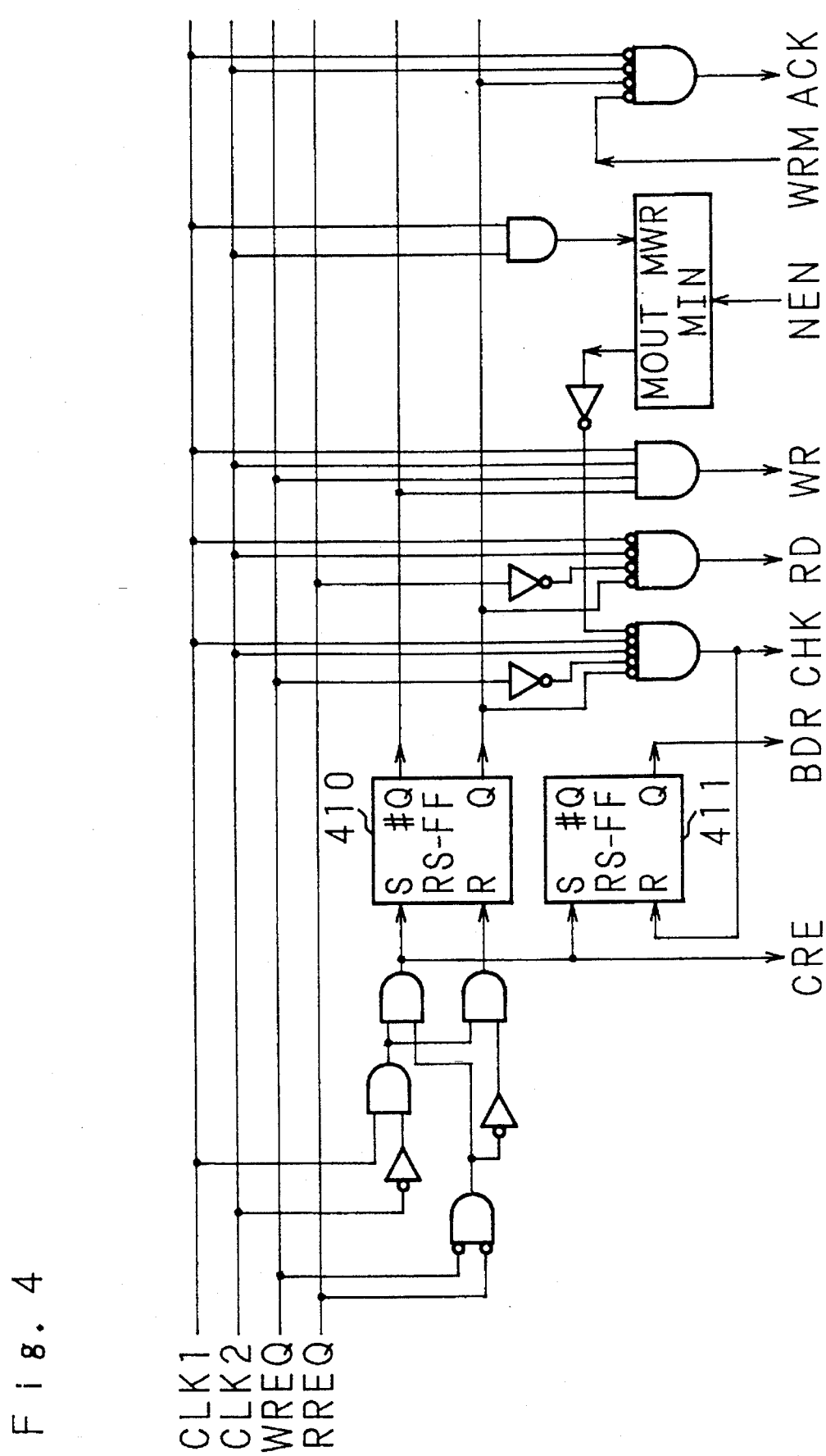
FIG. 4 is a block diagram showing a configuration of a control signal generator.
Figure 5:
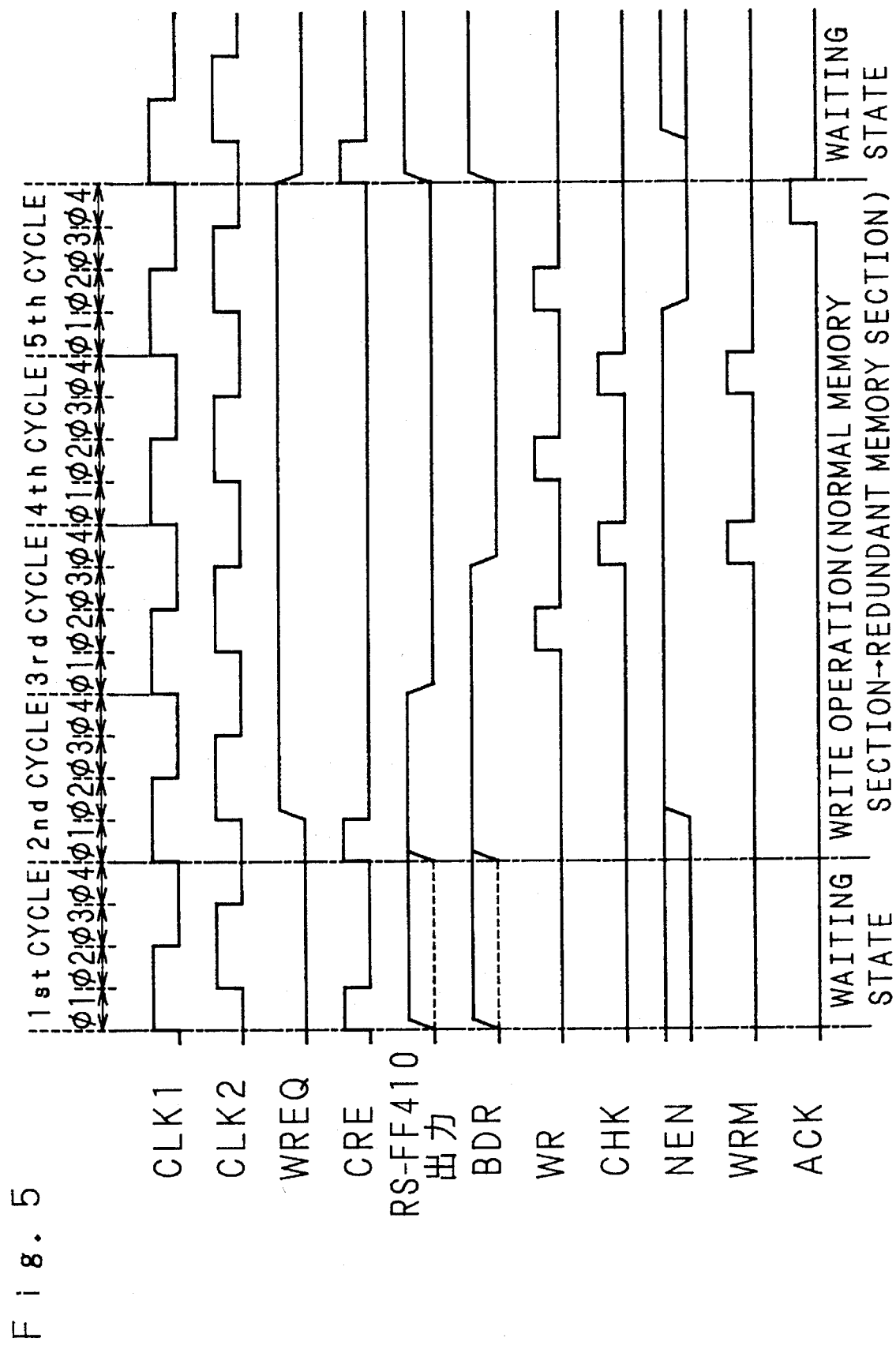
FIG. 5 is a timing chart for a write operation by the control signal generator.
Figure 6:
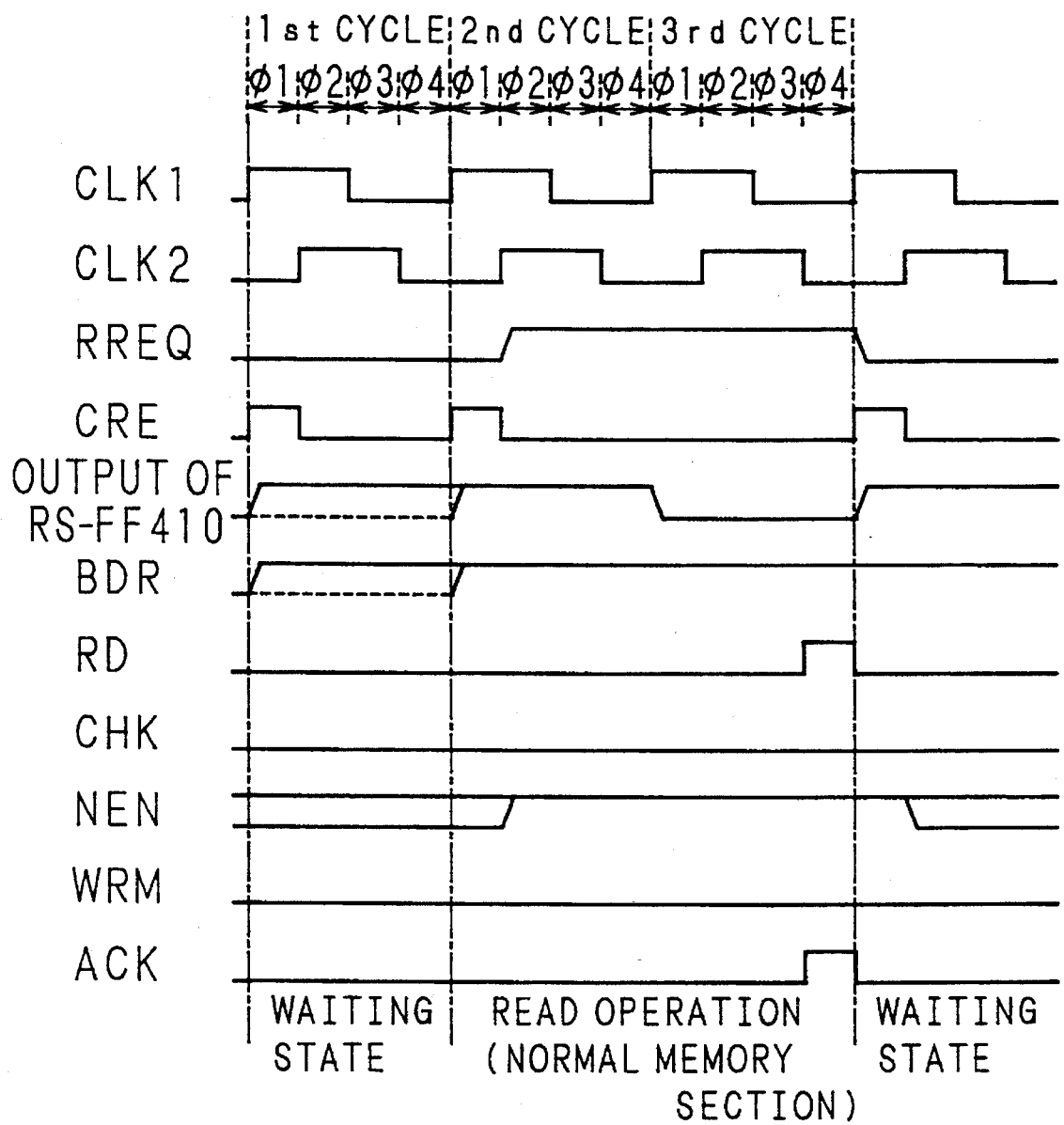
FIG. 6 is a timing chart for a read operation by the control signal generator.

FIG. 4 is a block diagram showing the configuration of the control signal generator 101, and FIGS. 5 and 6 show the timing charts for the signals generated by the control signal generator 101. The clock signals CLK1 and CLK 2 are of the same frequency, the phase of the clock CLK2 lagging behind that of the clock CLK1 by a quarter cycle. Here, the period in which the clock CLK1 is at a high level and the clock CLK2 is at a low level is designated by (H, L), in accordance with which the timings (H, L): $\phi1$, (H, H): $\phi2$, (L, H) : $\phi3$, and (L, L): $\phi4$ are defined, the timings $\phi1$ through $\phi4$ constituting one cycle.

Further, the operation performed during the period in which the write request signal is asserted is referred to as a write operation, and the operation performed during the period in which the read request signal RREQ is asserted is referred to as a read operation. The asserting conditions For the various signals will be described below with reference to FIGS. 4, 5, and 6.

In the situation where the write request signal WREQ and the read request signal RREQ are both negated, the counter reset signal CRE is asserted with the timing of $\phi1$. That is, by controlling the timing so that the write request signal WREQ or the read request signal RREQ is asserted with the timing of $\phi2$, the counter value of the error counter 105 shown in FIG. 1 is always reset upon the initiation of a write and read operation. The counter reset signal CRE is also applied to a set terminal S of an R-S flip-flop (hereinafter called the RS-FF) 410, while with the write request signal WREQ or the read request signal RREQ asserted, a signal asserted with the timing of $\phi1$ is applied to a reset terminal R of the RS-FF 410.

That is, the output of the RS-FF 410 is asserted in the first cycle of the write or read operation, and negated in the second and later cycles. Further, the counter reset signal CRE is applied to a set terminal S of an RS-FF 411, while the check signal CHK is applied to a reset terminal R thereof. The outputted of the RS-FF 411 is output as the input/output direction indicating signal BDR. That is, the output is asserted upon initiation of a write or read operation, and only negated by the first assertion of the check signal CHK in a write operation. Therefore, in a write operation, after the check signal CHK has been asserted, the external data EDT shown in FIG. 1 is prevented from being input as the data DAT, whereas in a read operation, the data DAT shown in FIG. 1 is always output as the external data EDT.

In the situation where the write request signal WREQ is asserted and the output of the RS-FF 410 is negated, the write signal WR is asserted with the timing of $\phi2$. On the other hand, the read signal RD is asserted with the timing of $\phi4$ in the situation where the read request signal RREQ is asserted and the output of the RS-FF 410 is negated.

Figure 7:
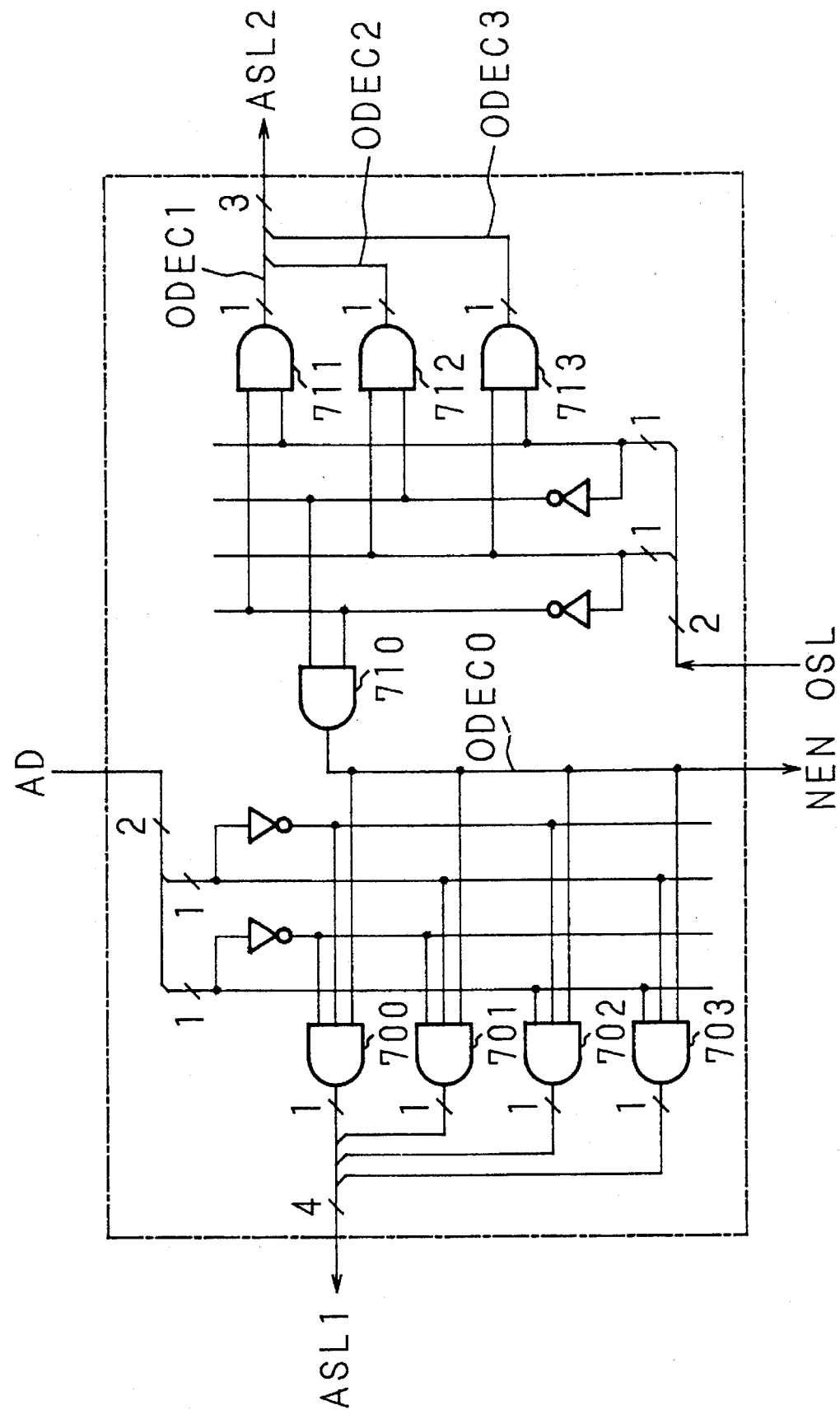
FIG. 7 is a block diagram showing a configuration of an area selector.

FIG. 7 is a block diagram showing the configuration of the area selector 102. The address signal AD consists of two encoded signals and is capable of specifying four write areas. The operation destination select signal OSL consists of two encoded signals and is capable of specifying four operation destinations. First, the operation destination signal OSL is decoded using AND circuits 710, 711, 712, and 713, to generate decoded signals ODEC0, ODEC1, ODEC2, and ODEC3. The decoded signals ODEC1, ODEC2, and ODEC3 are directly outputted as the area selection signal ASL2. On the other hand, the decoded signal ODEC0 is outputted as the normal-circuit enable signal NEN that specifies the normal memory section as the operation destination. The decoded signal ODEC0 is also applied to three-input AND circuits 700, 701, 702, and 703 whose outputs are then combined to produce the area selection signal ASL1.

Figure 8:
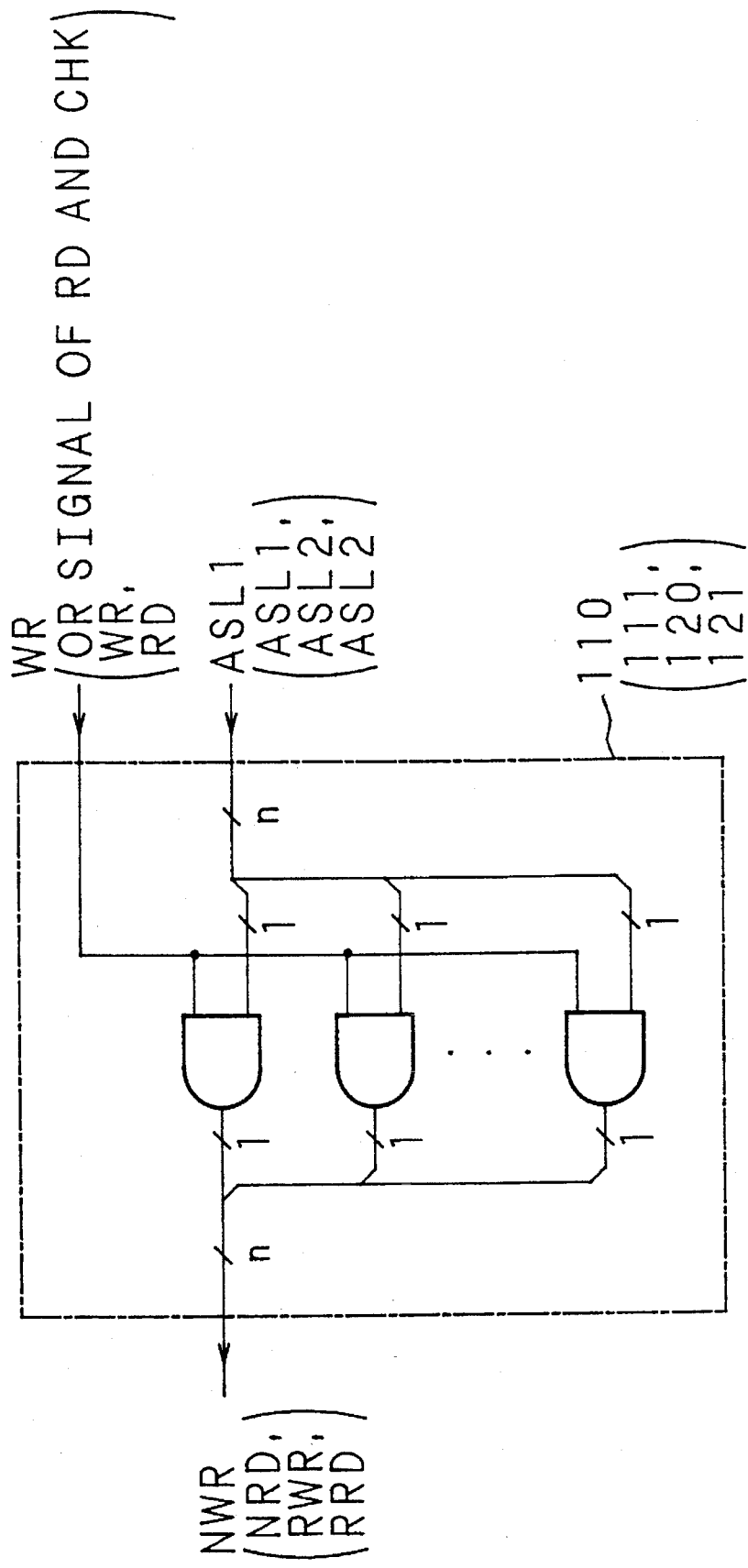
FIG. 8 is a block diagram showing a configuration common to a normal write controller, normal read controller, redundant write controller, and redundant read controller.

FIG. 8 is a block diagram showing the configuration of the normal write controller 110 (the normal read controller 111, the redundant write controller 120, and the redundant read controller 121 have the same configuration). In the case of the normal write controller 110 and the redundant write controller 120, the write signal WR is inputted; in the case of the normal read controller 111, the OR of the read signal RD and check signal CHK are inputted; and in the case of the redundant read controller 121, the read signal RD is inputted.

Further, in the case of the normal write controller 110 and the normal read controller 111, the area selection signal ASL1 is inputted; and in the case of the redundant write controller 120 and the redundant read controller 121, the area selection signal ASL2 is inputted. In the normal write controller 110 (the normal read controller 111; the redundant write controller 120; the redundant read controller 121), each of n area-selection signal inputs ASL1 (ASL1; ASL2; ASL2 ) is ANDed with the write signal WR (the OR of the read signal RD and check signal CHK; the write signal WR; the read signal RD), to produce n normal-write control signal outputs NWR (the normal-read control signal outputs NRD; the redundant-write control signal outputs RWR; the redundant-read control signal outputs RRD).

Figure 9:
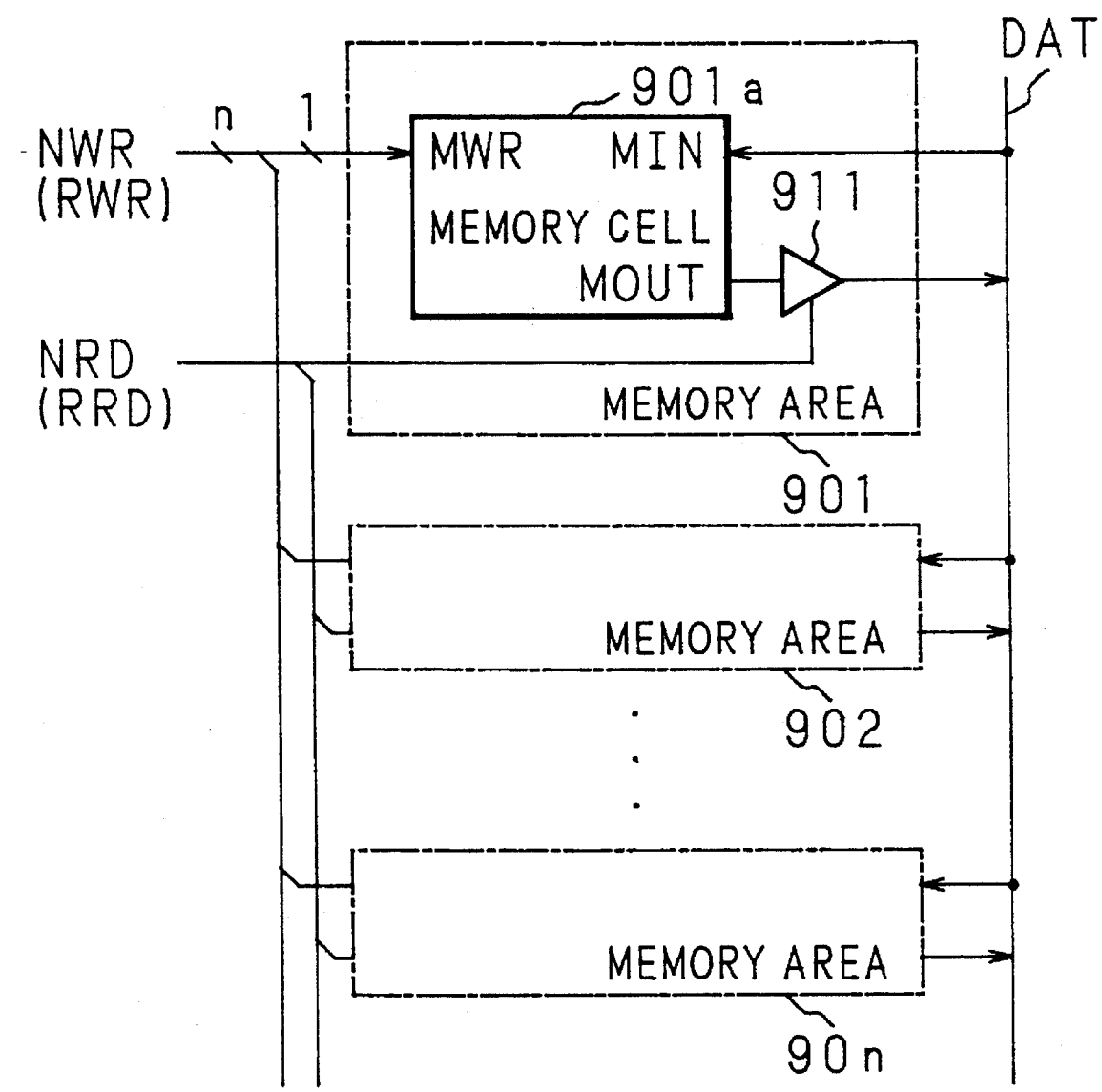
FIG. 9 is a block diagram showing a configuration common to a normal memory section and a redundant memory section.

FIG. 9 is a block diagram showing the configuration of the normal memory section 112 (the redundant memory section 122). In the case of the normal memory section 112 (redundant memory section 122), the normal write control signal NWR (the redundant write control signal RWR) and the normal read control signal NRD (the redundant read control signal RRD) are input. The normal write control signal NWR (the redundant write control signal RWR) and the normal read control signal NRD (the redundant write control signal RRD) each provide n inputs which correspond to memory areas 901, 902, ..., 90n on a one-to-one basis. The operation of the memory section will be described by taking the memory area 901 as an example. When the normal write control signal NWR (the redundant write control signal RWR) is asserted, the value of the data DAT is latched via a terminal MIN and stored into a memory cell 901a. The value thus stored is always outputted via a terminal MOUT of the memory cell 901a and inputted to a tri-state buffer 911. When the normal read control signal NRD (the redundant read control signal RRD) is asserted, the tri-state buffer 911 outputs the contents of the memory cell 901a as the data DAT. The other memory cells 902, ..., 90n operate in the same manner.

Figure 10:
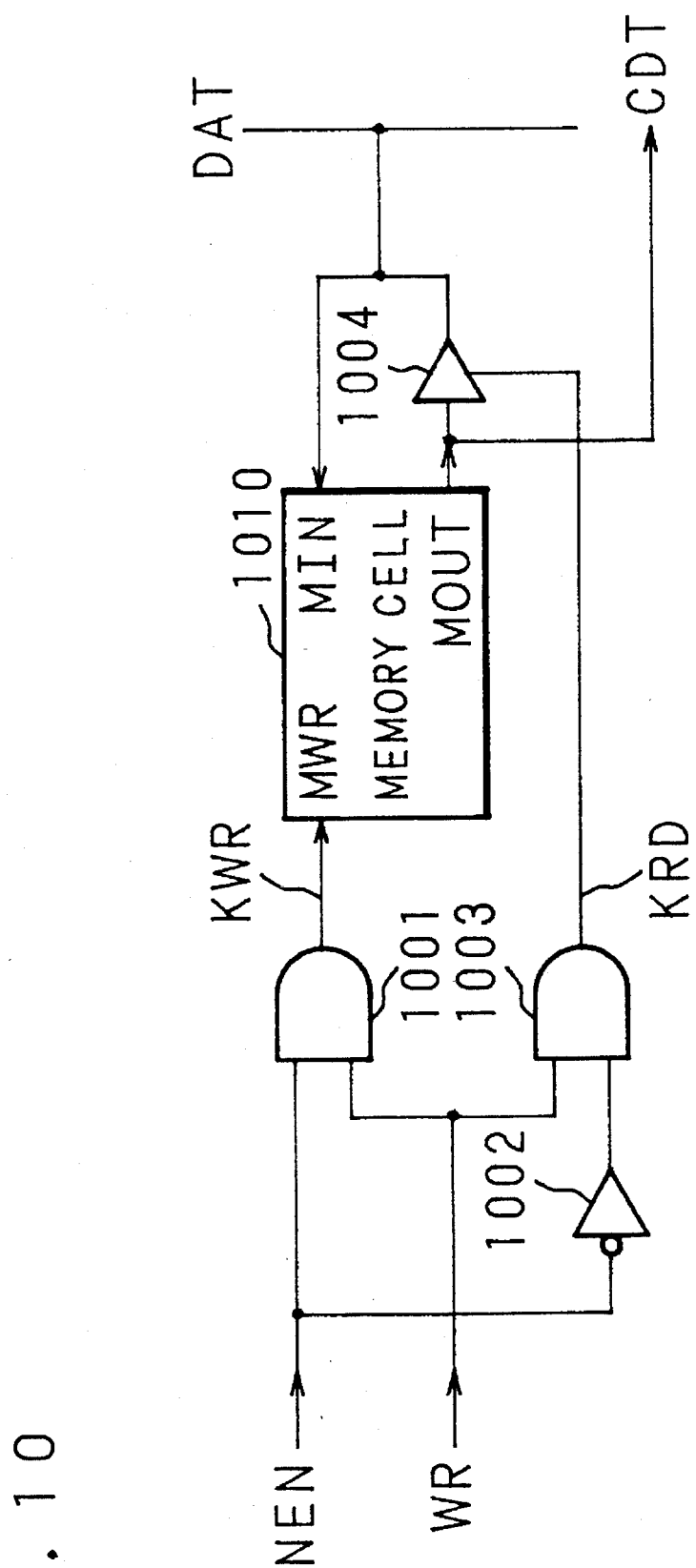
FIG. 10 is a diagram showing a configuration of a write data buffer.

FIG. 10 is a block diagram showing the configuration of the write data buffer 107. A buffered-data write signal KWR that directs the writing of the data DAT held in the write buffer is generated by an AND circuit 1001 to which the normal-circuit enable signal NEN and the write signal WR are inputted. A buffered-data read signal KRD that directs an output to the data DAT is generated by an AND circuit 1003 to which the write data WR and the normal-circuit enable signal NEN with its logic level inverted by an inverter 1002 are input. The buffered-data read signal KRD output from the AND circuit 1003 is applied to the control terminal of a tri-state buffer 1004 to control the output of the data held in a memory cell 1010 as the data DAT. Also, the data held therein is always outputted as the data check signal CDT.

Figure 11:
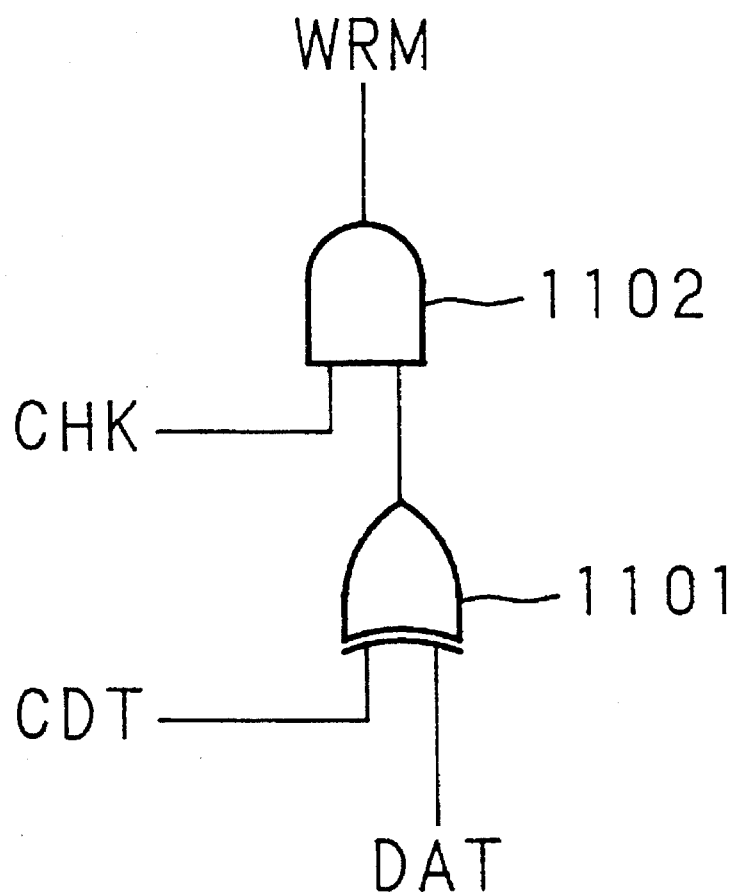
FIG. 11 is a block diagram showing a configuration of an error detector.

FIG. 11 is a block diagram showing the configuration of the error detector 106. Error detection is performed by comparing the data check signal CDT with the data DAT by an EXOR circuit 1101. The result of the comparison is effective during the period in which the check signal CHK is asserted. Therefore, the output of the EXOR circuit 1101 and the check signal CHK are ANDed by an AND circuit 1102 which then outputs the result as the error detection signal WRM.

Figure 12:
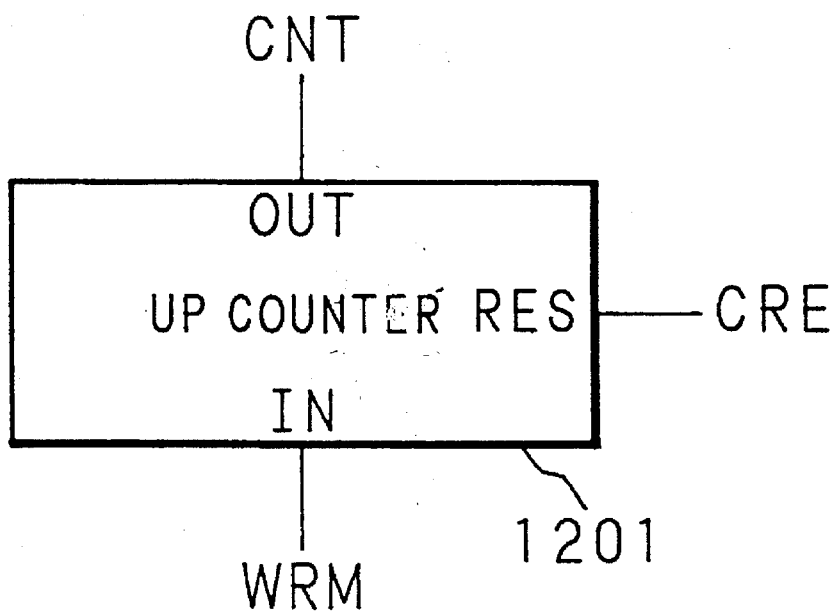
FIG. 12 is a block diagram showing the configuration of an error counter.

FIG. 12 is a block diagram showing the configuration of the error counter 105. An up counter 1201 has a count signal input terminal IN at which a signal to be counted is input, an output signal terminal OUT at which the counter value is outputted, and a reset signal terminal RES at which a reset signal to reset the counter value is inputted. The error detection signal WRM is applied to the count signal terminal IN and the counter reset signal CRE applied to the reset signal terminal RES. The error count signal CNT is outputted at the output signal terminal OUT.

Figure 13:
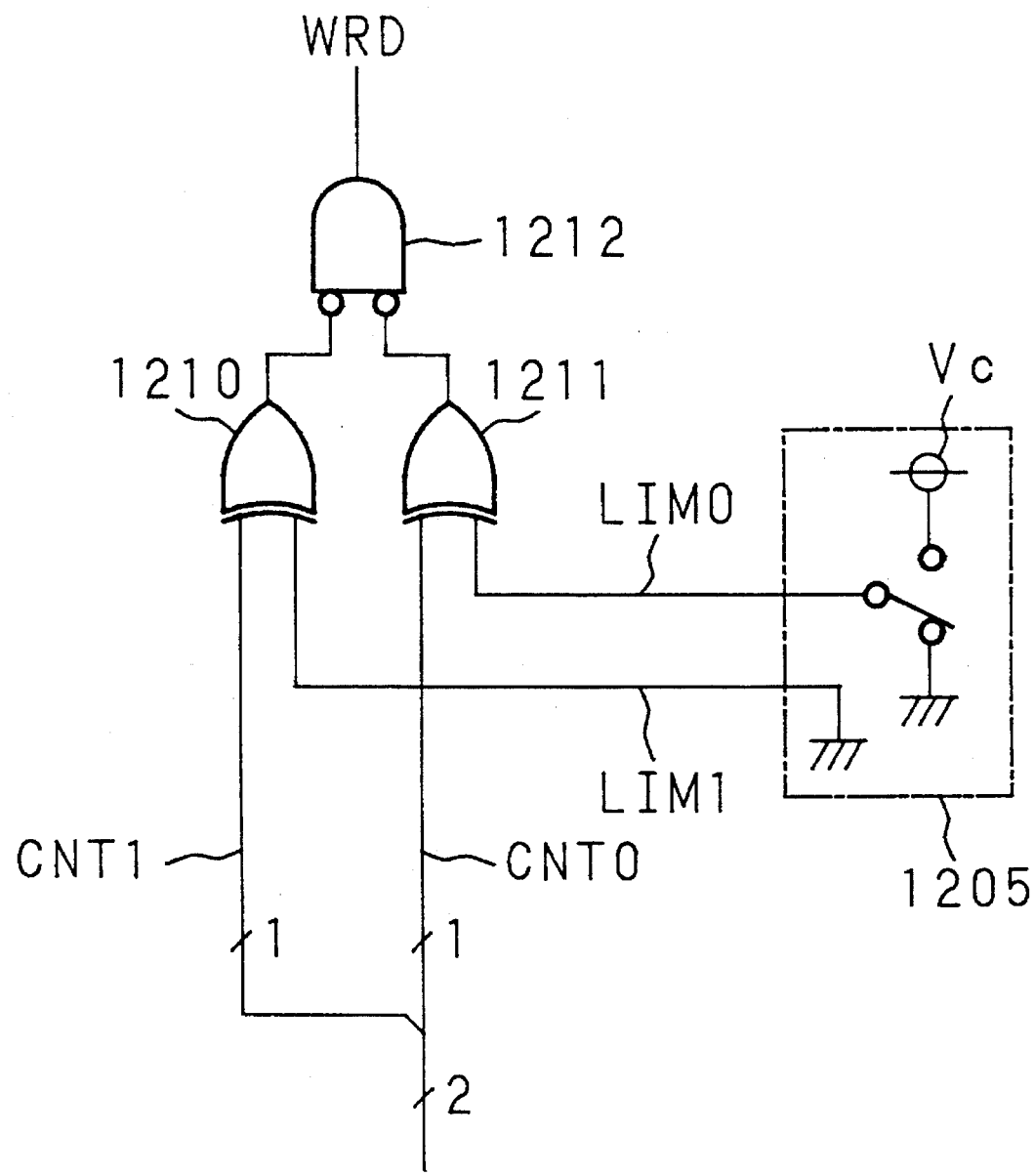
FIG. 13 is a block diagram showing a configuration of a write-disable detector.

FIG. 13 is a block diagram showing the configuration of the write-disable detector 104. An initialization section 1205 outputs a reference value signal LIM that sets the number of write failure occurrences that renders the writing impossible. The reference value set in the initialization section 1205 can be set externally, but for the convenience of explanation, it is assumed here that the value is set at the time of circuit design. The number of reference value signal lines LIM and the number of error count signal lines CNT are determined depending on the number of write failure occurrences that renders the writing impossible. In this example, it is assumed that this number is two, i.e., reference value signals LIM0 and LIM1, and error count signals CTN0 and CTN1, respectively. The comparison between the reference value signals LIM and the error count signals CNT is made by the EXOR circuits 1210 and 1211. The output of each of EXOR circuits 1210 and 1211 is negated when its inputs match, and asserted when its inputs do not match. Therefore, by supplying the outputs of the EXOR circuits 1210 and 1211 as inputs to a NOR circuit 1212, the write-disable detection signal WRD is obtained from the NOR circuit 1212.

Figure 14:
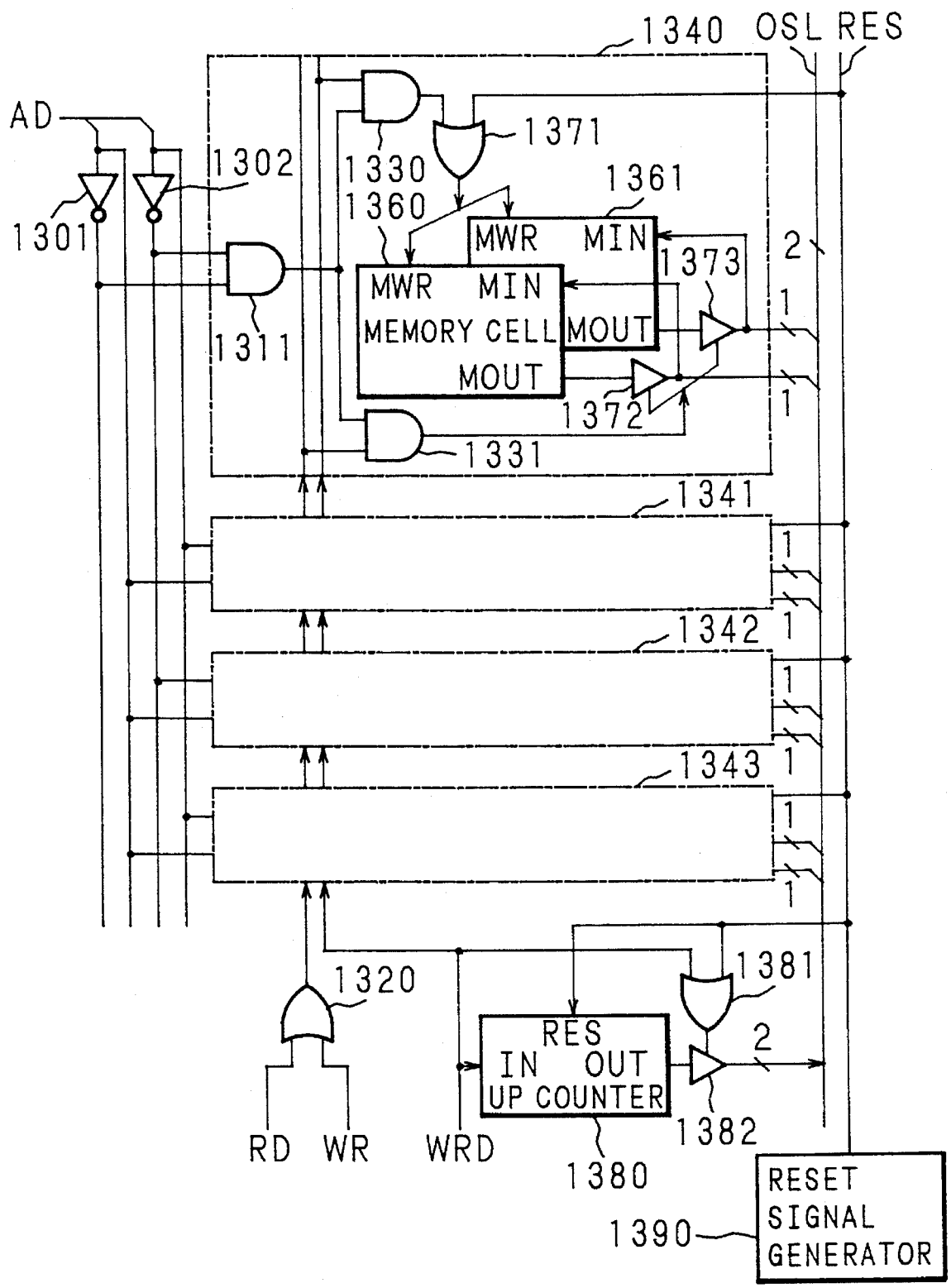
FIG. 14 is a block diagram showing a configuration of a defective-area indicator.

FIG. 14 is a block diagram showing the configuration of the defective-area indicator 103. The operation of the defective-area indicator 103 will be described, assuming that both address signals AD are at the low level. The operation of the defective-area indicator 103.is classified into two modes, an initialization operation mode and a normal operation mode. Further, the normal operation mode consists of two stages, the first stage for reading a memory cell and the second stage for writing to a memory cell when the write-disable detection signal WRD is asserted. The initialization operation, the first-stage normal operation, and the second-stage normal operation will be described below in this order.

The initialization operation means the operation for resetting the memory cells storing failure states of the normal memory section 112. The following description deals with a failure-state memory section 1340 that stores the failure state of a write area "0" of the normal memory section 112, but it will be appreciated that the same description applies to other memory areas. Since the operation destination select signal OSL is output via two lines, each failure-state memory section contains two memory cells.

A reset signal generator 1390 generates a reset signal RES which is asserted only once when the power to the circuit shown in FIG. 1 makes a transition from the off to the on state. When the reset signal RES is asserted, the counter value of an up counter 1380 that indicates a defective area to be replaced by the normal memory section is resetted, and the resulting output is fed through a tri-state buffer 1382 and output as the operation destination select signal OSL. The reset signal RES is also applied via an OR circuit 1371 to a write control terminal of a memory cell 1360 which then latches the value of the operation destination select signal OSL, i.e. "0". The memory cell reset operation is thus completed.

Next, the data output operation of the memory cell will be described. The address signal AD is inputted to an AND circuit 1311 via inverters 1301 and 1302, and an address decode signal ADECO is asserted. On the other hand, the write signal WR and the read signal RD are ORed by an OR circuit 1320. The output of the OR circuit 1320 is supplied as an input to an AND circuit 1331 where it is ANDed with the address decode signal ADECO. The output of the AND circuit 1331 is applied to control terminals of tri-state buffers 1372 and 1373. With these operations, the information concerning the replacement of the normal memory section 112 by the redundant memory section 122 is outputted as the operation destination select signal OSL.

The following describes the operation when the write-disable detection signal WRD is asserted. In accordance with the operation destination select signal OSL output as a result of the data output operation of the memory cell 1360, as described above, a write operation is performed to write data into the normal memory section 112 shown in FIG. 1. Immediately after that a read operation is performed, and if the readout value is different from the value just written, the following operation is performed. The address signal AD is inputted to the AND circuit 1311 via the inverters 1301 and 1302, and the address decode signals ADEC is asserted to initiate the reading of the memory cells 1360 and 1361. At this time, if the write-disable detection signal WRD is asserted, the up counter 1380 is incremented, and a signal indicating a defective area to be replaced is output as the operation destination select signal OSL. At the same time, the write-disable detection signal WRD and the address decode signal ADECO are ANDed by an AND circuit 1330 whose output is then fed to the OR circuit 1371 and then on to write control terminals MWR of the memory cells 1360 and 1361. Data indicating the replacement of defective areas in accordance with the operation destination select signal OSL are thus stored in the memory cells 1360 and 1361, so that in subsequent read operations, signals indicating the replaced defective areas are output.

Figure 15:
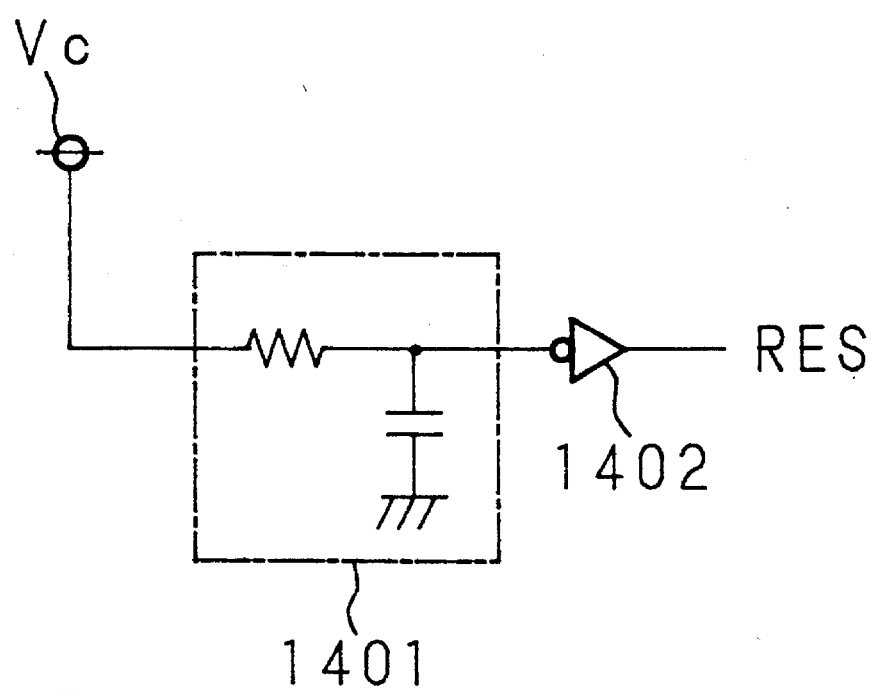
FIG. 15 is a block diagram showing a configuration of a reset signal generator.
Figure 16:
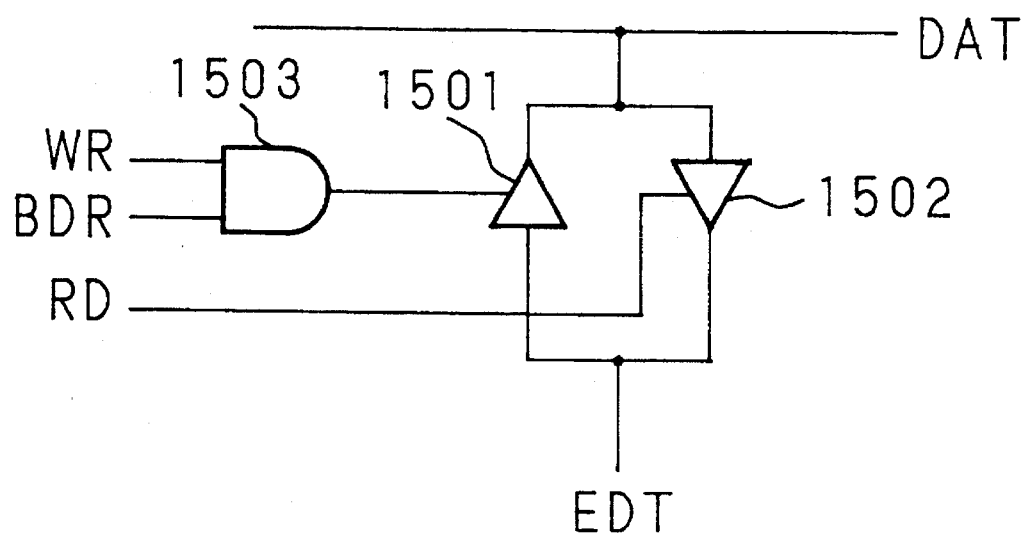
FIG. 16 is a block diagram showing a configuration of an input/output I/F.

FIG. 15 is a block diagram showing the configuration of the reset signal generator 1390 shown in FIG. 14. The reset signal is generated by the rising of the supply voltage when the power supply Vc is turned on. To achieve this, the input of an integrating circuit 1401 is coupled to the power supply, and the output of the integrating circuit 1401 is inverted by an inverter 1402, thus obtaining the reset signal RES FIG. 16 is a block diagram showing the configuration of the input/output I/F 108. The read signal RD is applied to the control terminal of a tri-state buffer 1502; that is, in a read operation, the data DAT is output as the external data EDT through the tri-state buffer 1502. On the other hand, the write signal WR and the input/output direction indicating signal BDR are ANDed by an AND circuit 1503 whose output is then applied to the control terminal of a tri-state buffer 1501. That is, in a write operation, the external data EDT is inputted as the data DAT only in the second cycle.

Figure 17:
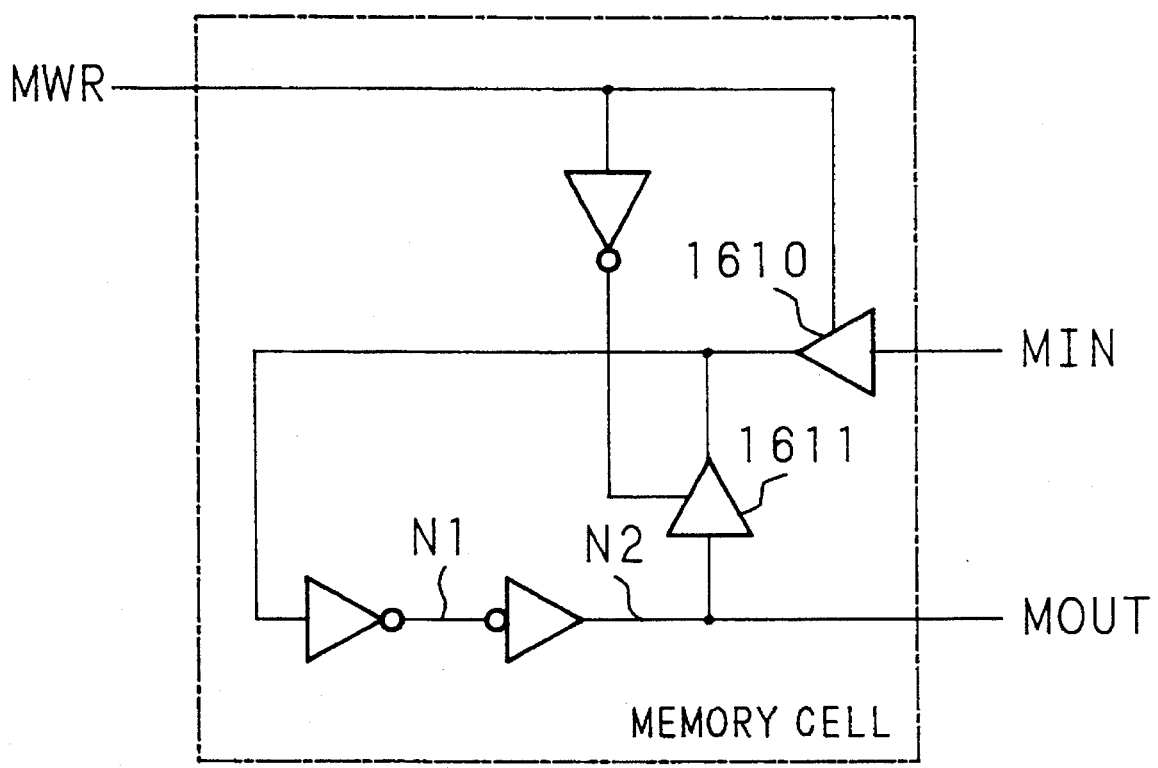
FIG. 17 is a block diagram showing a configuration of a memory cell.

FIG. 17 is a block diagram showing the configuration of the memory cell shown in FIGS. 4, 9, 10, and 14. When the memory cell write signal MWR is asserted, the tri-state buffer 1611 is placed into the OFF state. This allows the value of the memory cell input signal MIN to be transferred to a memory node NO. The data thus transferred is further transferred to a memory node N1 and on to a memory node N2, thus accomplishing data write. On the other hand, when the memory cell write signal MWR is negated, the tri-state buffer 1610 is placed into the OFF state, while the tri-state buffer 1611 is placed into the ON state. As a result, the value at the memory node N2 is transferred to the memory node NO where the data is held. The thus held data is always outputted as the memory cell output signal MOUT.

The operations of the various parts shown in FIG. 1 have been described above. Further explanation will be given below with reference to the timing charts illustrating the operation of each part.

Figure 18:
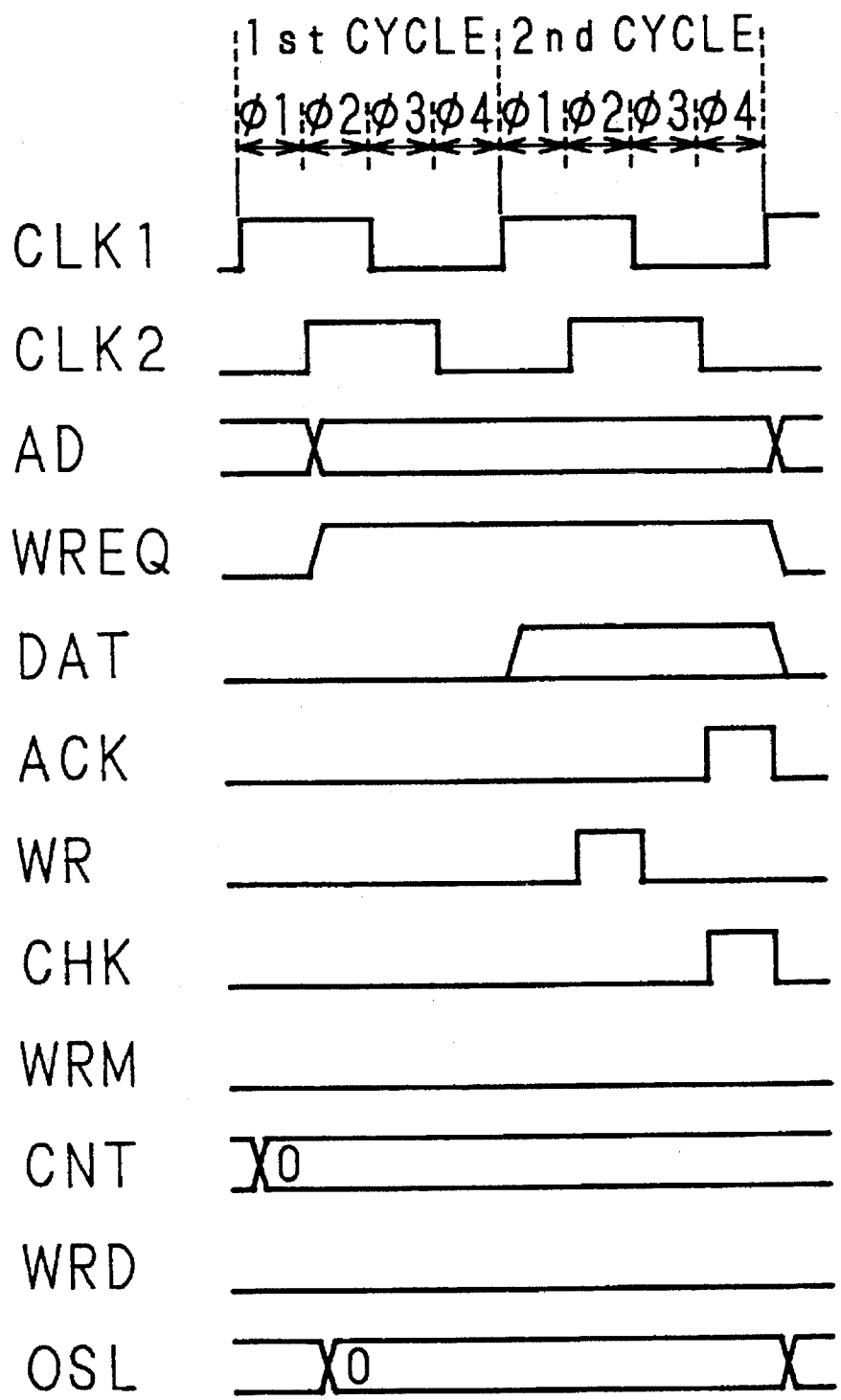
FIG. 18 is a timing chart for a write operation into a normal memory section.

FIG. 18 shows the timing chart for explaining a write operation into the normal memory cell 112 when the normal memory cell 112 operates properly. The circuit shown in FIG. 1 will be described in sequence in terms of operation timing.

First, the error count signal CNT is reset with the timing of $\phi1$ in the first cycle of the write operation. Next, the write request signal WREQ is asserted with the timing of $\phi2$ in the first cycle, which causes the operation destination select signal OSL to change. In this example, since the destination for writing is the normal memory section 112, the value of the operation destination select signal OSL is "0". By asserting the write signal WR with the timing of $\phi2$ in the second cycle, the value of the data DAT is written into the write area designated within the normal memory section 112 by the address signal AD.

Next, the check signal CHK is asserted with the timing of $\phi4$ in the second cycle, whereupon the value held in the normal memory section 112 is compared with the value held in the write data buffer 107 and the output of the error detection signal WRM is checked. In this example, the error detection signal WRM remains negated since no errors have been detected. Since the error detection signal WRM is negated, the request acknowledge signal ACK is asserted with the timing of $\phi4$ to complete the write operation.

Figure 19:
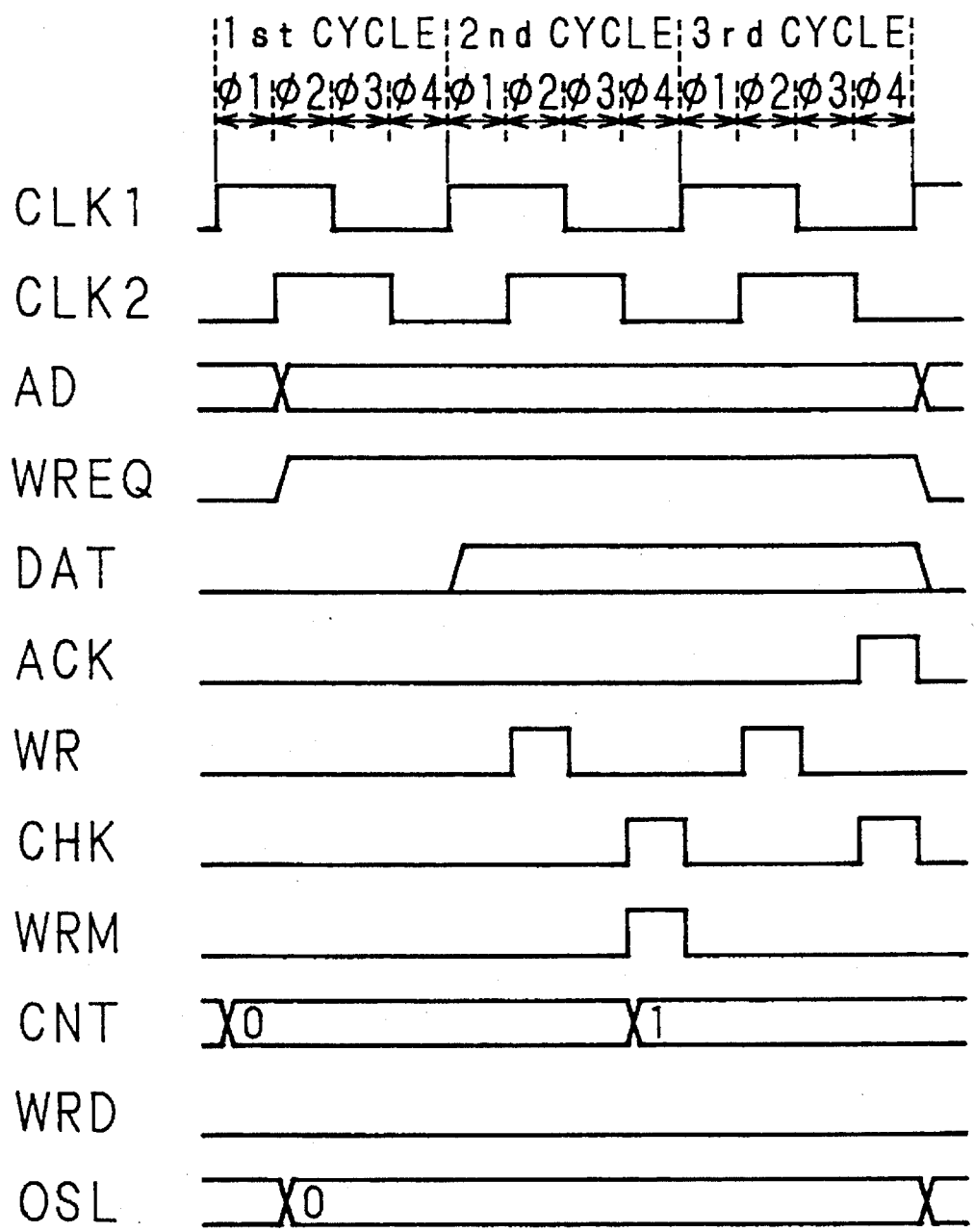
FIG. 19 is a timing chart for a write operation into the normal memory section.

FIG. 19 shows the timing diagram for a write operation into the normal memory cell 112 when one write error occurs in the normal memory section. The timing chart shown is different from that of FIG. 18 in that, in the case of FIG. 19, the error detection signal WRM is asserted with the timing of $\phi4$ in the second cycle. As a result, the request acknowledge signal ACK is not asserted with the timing of $\phi4$ in the second cycle, and since the error count signal CNT has not reached the predetermined reference value, the write-disable signal WRD remains negated. Therefore, the write operation is continued. With the timing of $\phi2$ in the third cycle, the data held in the write data buffer 107 is outputted as the data DAT, while, at the same time, the value of the data DAT is written once again into the same write area within the normal memory section 112 that was written into in the second cycle. Next, the check signal CHK is asserted for a second time with the timing of $\phi4$ in the third cycle. Since the error detection signal WRM remains negated, the request acknowledge signal ACK is asserted to complete the write operation.

Figure 20:
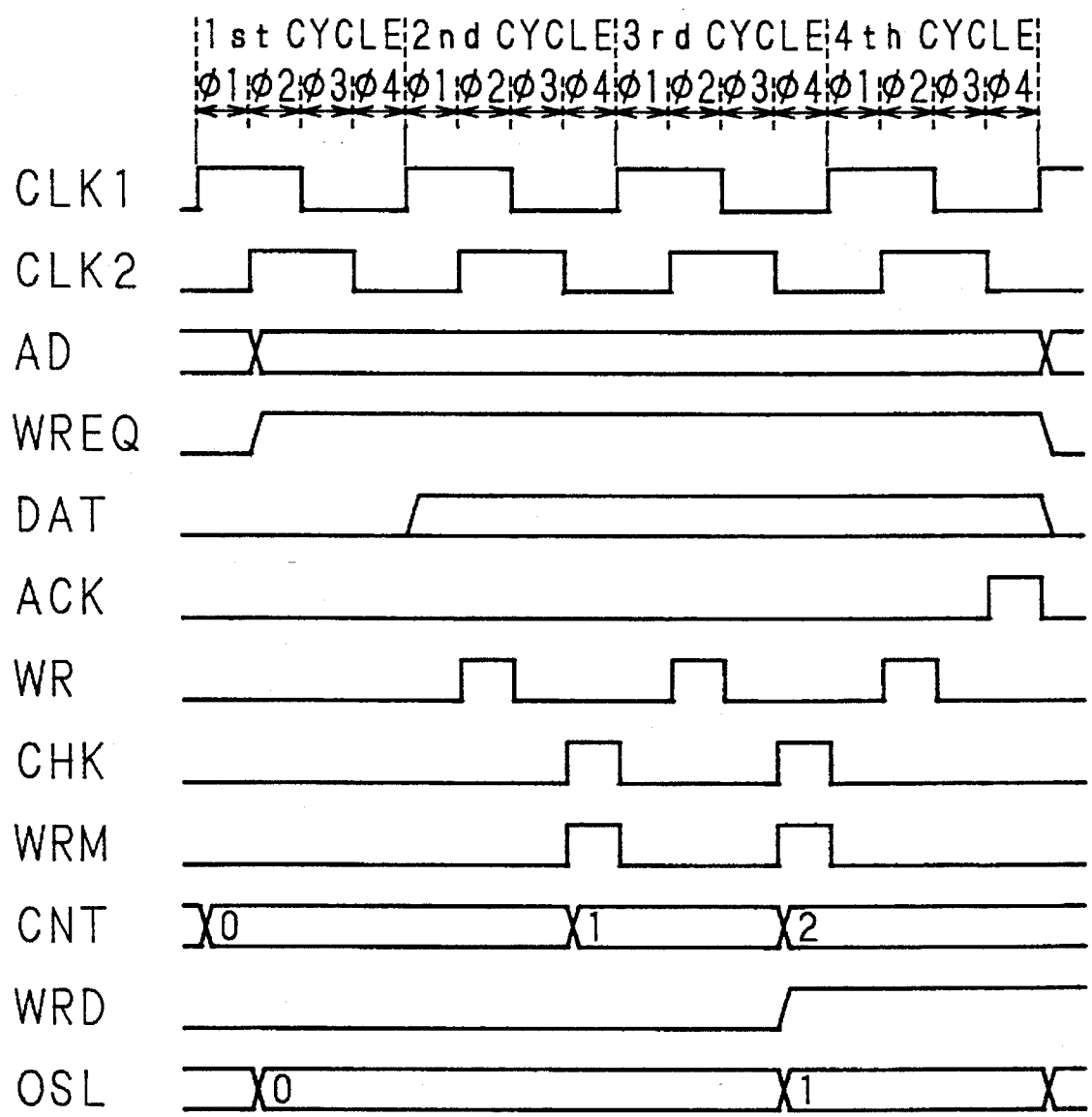
FIG. 20 is a timing chart for a write operation into the normal memory section.

FIG. 20 shows the timing chart for explaining a write operation when the normal memory section 112 is designated as the write destination but the normal memory section 112 is rendered defective. The timing chart shown is different from that of FIG. 19 in that, in the case of FIG. 20, with the timing of $\phi4$ in the third cycle the error detection signal WRM is again asserted. As a result, the request acknowledge signal ACK is not asserted with the timing of $\phi4$ in the third cycle, and the error count signal CNT reaches the predetermined reference value, causing the write-disable signal WRD to be asserted while letting the write operation further continue. When the write-disable signal WRD is asserted, the value of the operation destination select signal OSL changes, thereby switching the operation destination from the normal memory section 112 to the redundant memory section 122. Thus, with the timing of $\phi2$ in the fourth cycle, writing is done into the area designated within the redundant memory section 122 by the operation destination select signal OSL. Then, with the timing of $\phi4$ in the fourth timing, the check signal CHK is not asserted, but the request acknowledge signal ACK is always asserted to complete the write operation.

Figure 21:
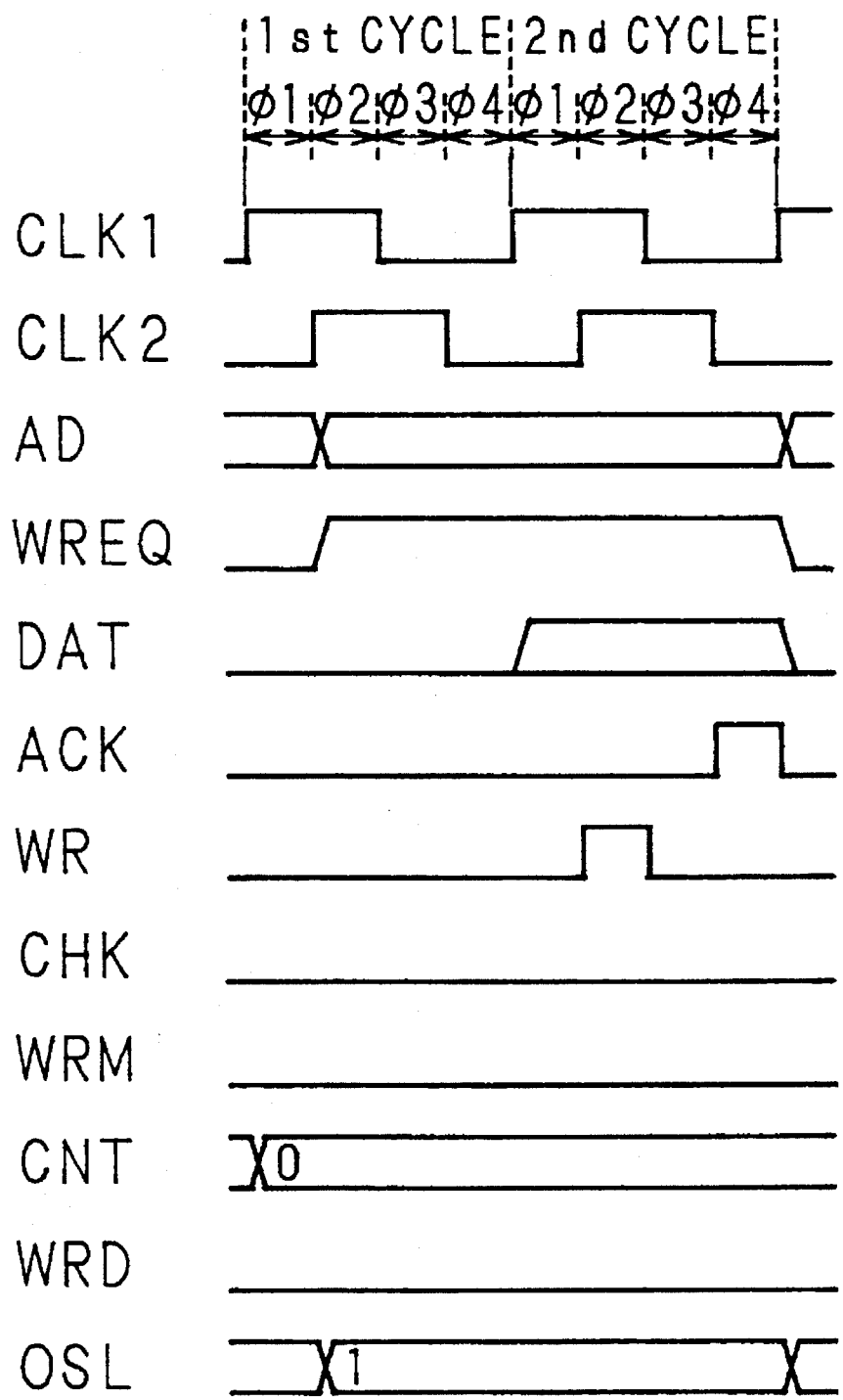
FIG. 21 is a timing chart for a write operation into the redundant memory section.

FIG. 21 shows the timing chart for explaining a write operation when the redundant memory cell 122 is the destination of the write operation. The timing chart shown is different from that of FIG. 18 in that, with the timing of $\phi2$ in the first cycle in FIG. 21, the operation destination select signal OSL outputs a value indicating that the normal memory section 112 is defective. Thus, with the timing of $\phi2$ in the second cycle, the destination of the write operation is switched to the redundant memory section 122, and the value of the data DAT is written into the write area within the redundant memory section 122 that has been selected by the operation destination select signal OSL. The request acknowledge signal ACK is always asserted with the timing of $\phi4$ in the second cycle, to complete the write operation.

Figure 22:
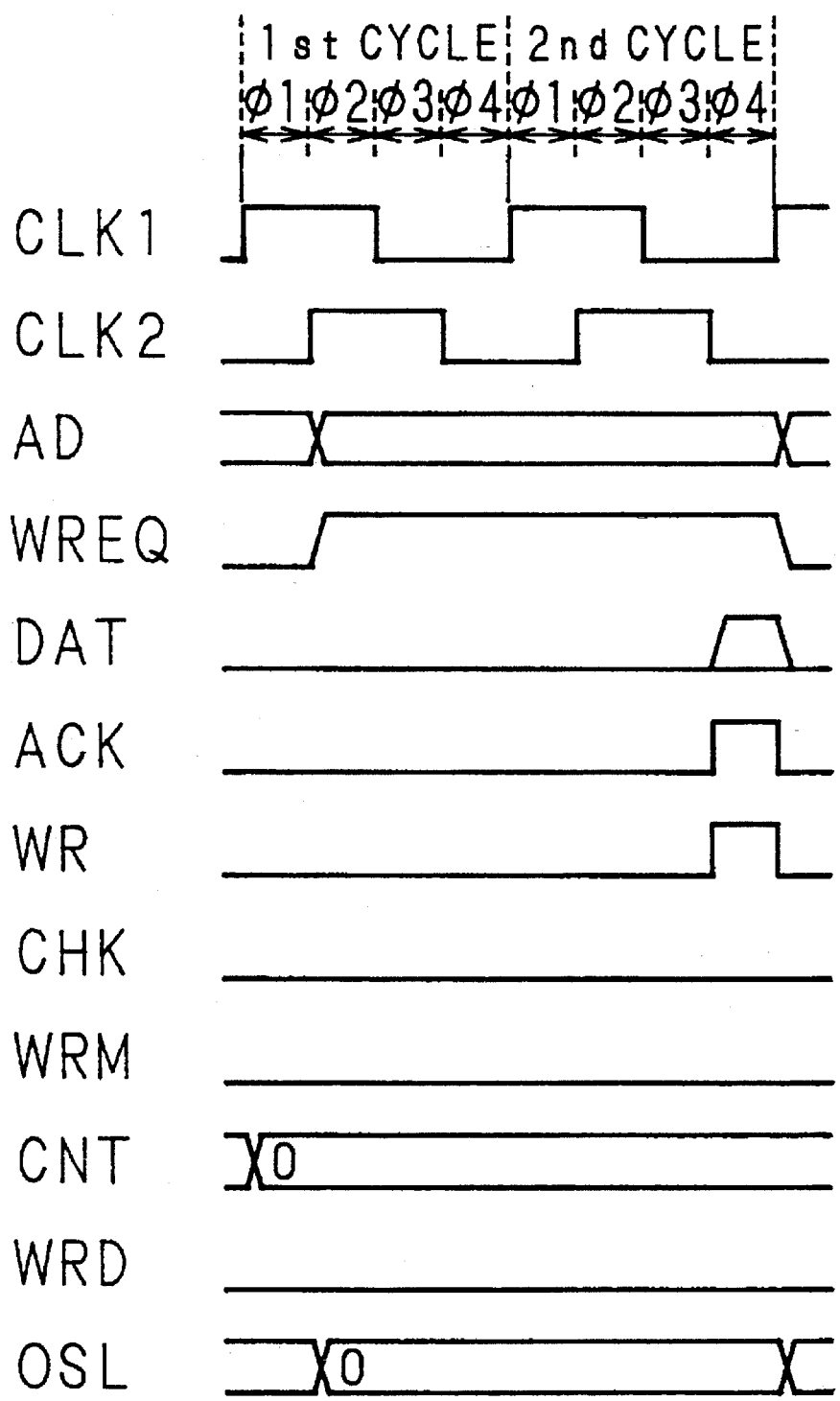
FIG. 22 is a timing chart for a write operation into the redundant memory section.

FIG. 22 shows the timing chart for a read operation when the normal memory section 112 is the operation destination. Referring to FIG. 22, the memory device shown in FIG. 1 will be described from the viewpoint of operation timing. First, the error count signal CNT is reset with the timing of $\phi1$ in the first cycle of the read operation. Next, the read request signal RREQ is asserted with the timing of $\phi2$ in the first cycle, which causes the operation destination select signal OSL to change. In this example, the value of the operation select signal OSL is "0" since the normal memory section 112 is the destination for reading. Next, with the timing of φ4 in the second cycle, the value held in the storage area designated within the normal memory section 112 by the address signal AD is outputted as the data DAT. In a read operation, since the check signal CHK is not asserted, the error detection signal WRM remains negated, so that the request acknowledge signal ACK is asserted with the timing of φ4 in the second cycle to complete the read operation.

Figure 23:
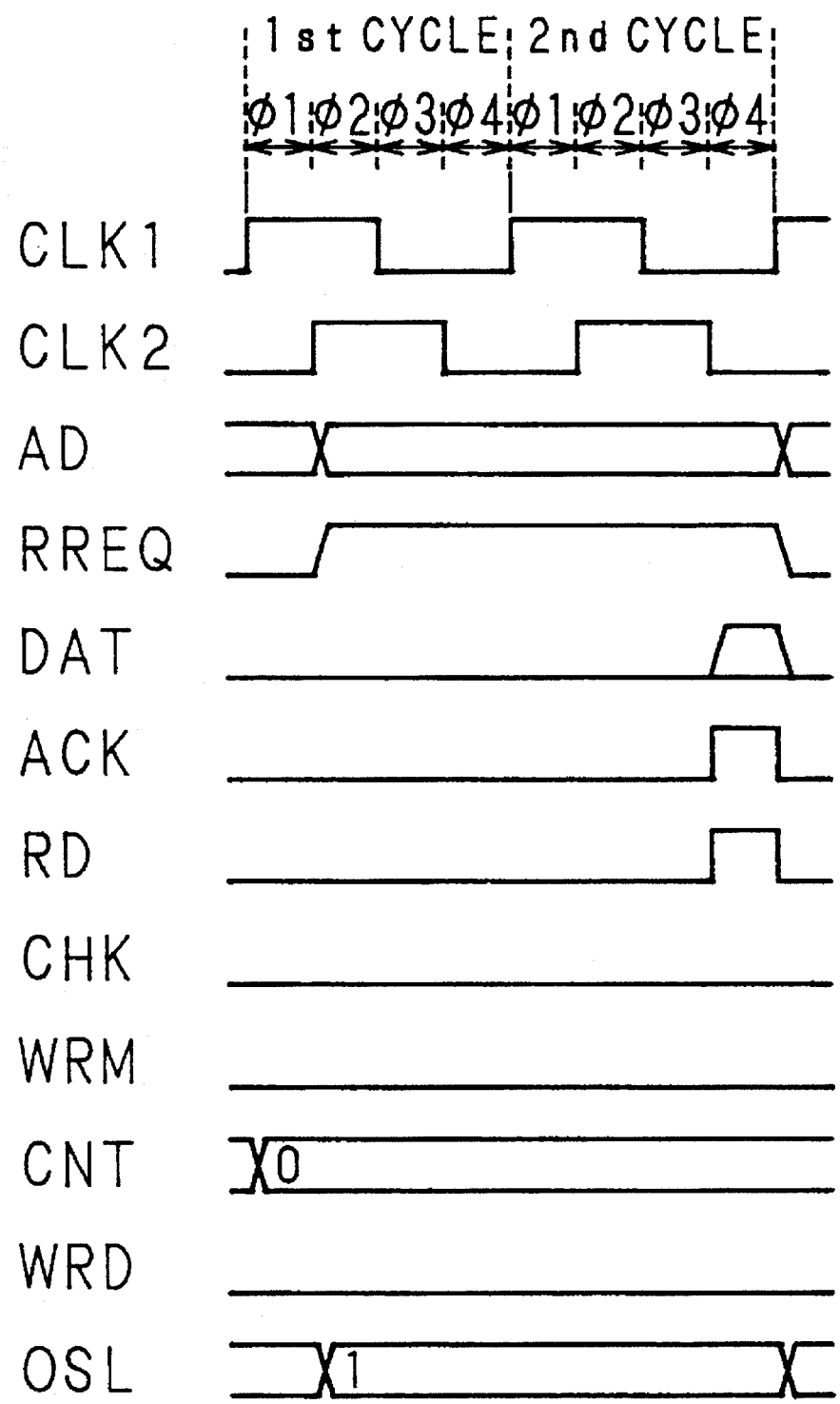
FIG. 23 is a timing chart for a write operation into the redundant memory section.

FIG. 23 shows the timing chart for a read operation when the redundant memory section 122 is the operation destination. The timing chart shown is different from that of FIG. 22 in that, with the timing of φ2 in the first cycle in FIG. 23, the operation destination select signal OSL outputs a value indicating that the normal memory section 112 is defective. Therefore, with the timing of φ4 in the second cycle, the destination of the read operation is switched to the redundant memory section 122, and the value held in the storage area within the redundant memory section 122 selected by the operation destination select signal OSL is outputted as the data. Otherwise, the operation is the same as that shown in FIG. 22. With the timing of φ4 in the second cycle, the request acknowledge signal ACK is always asserted to complete the read operation.

2nd Embodiment

Figure 24:
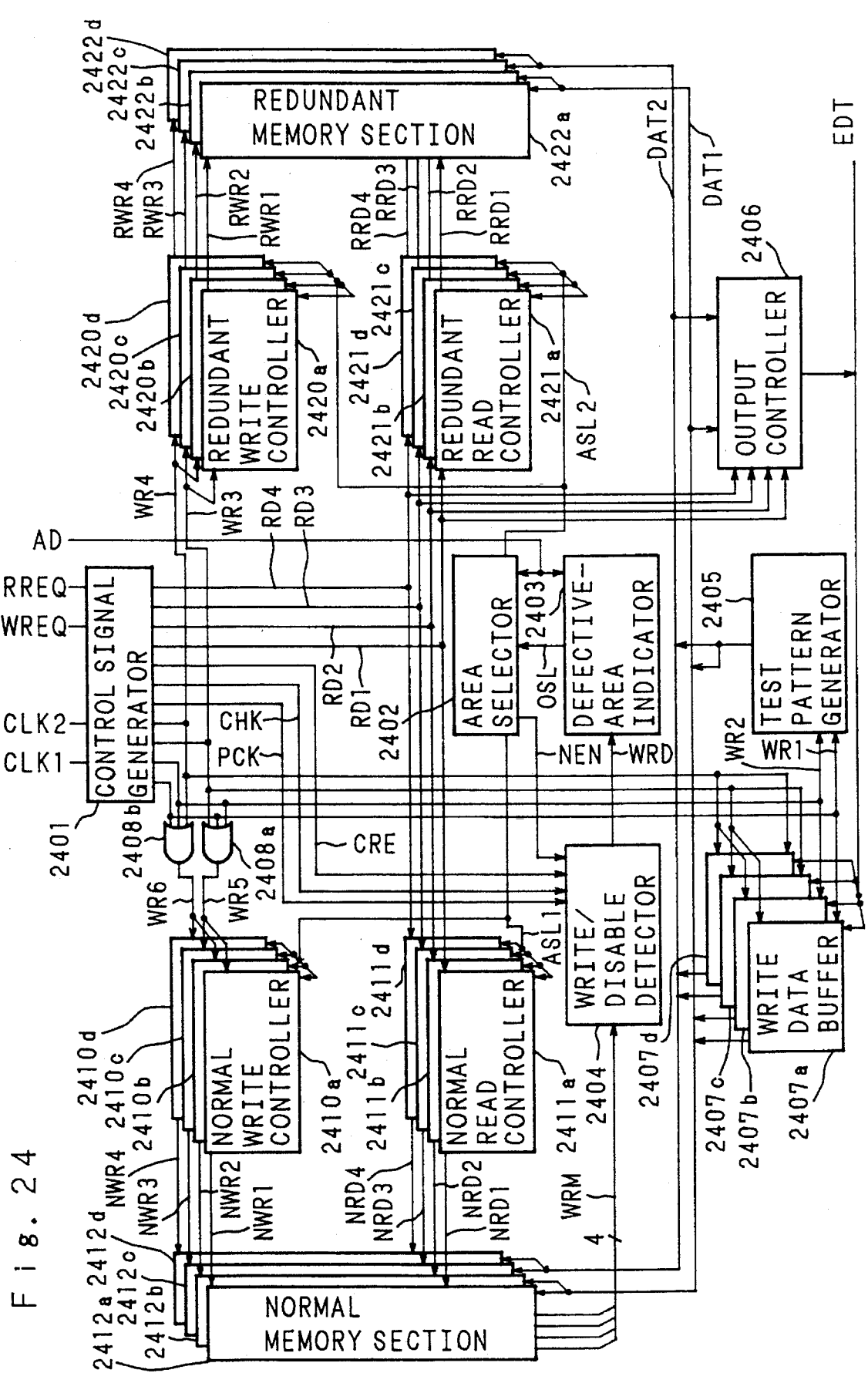
FIG. 24 is a block diagram showing a configuration of a memory device according to a second embodiment of the present invention.

FIG. 24 is a block diagram showing the configuration of a memory device according to a second embodiment of the present invention. This memory device is organized so that memory sections are successively accessed for four words. Clock signals CLK1 and CLK2, a write request signal WREQ, a read request signal RREQ, and an address signal AD are inputted from the outside. The externally generated clock signals CLK1 and CLK2, write request signal WREQ, and read request signal RREQ are inputted to a control signal generator 2401. Write signals WR1 and WR2 output from the control signal generator 2401 are both supplied to a test pattern generator 2405. At the same time, the write signal WR1 is applied to the second input terminal of a three-input OR circuit 2408a, the first input terminal of a three-input OR circuit 2408b, and also to a write data buffer 2407a. The write signal WR2 is applied to the third input terminal of the three-input OR circuit 2408a, the second input terminal of the three-input OR circuit 2408b, and also to a write data buffer 2407b.

Write signals WR3 and WR4 output from the control signal generator 2401 are supplied to write data buffers 2407c and 2407d, respectively. At the same time, the write signal WR3 is applied to the first input, terminal of the three-input OR circuit 2408a and also to redundant write controllers 2420a and 2420c, while the write signal WR4 is applied to the third input terminal of the three-input OR circuit 2408b as well as to redundant write controllers 2420b and 2420d. A write signal WR5 output from the three-input OR circuit 2408a is supplied to normal write controllers 2410a and 2410c. A write signal WR6 output from the three-input OR circuit 2408b is supplied to normal write controllers 2410b and 2410d. Read signals RD1, RD2, RD3, and RD4 output from the control signal generator 2401 are supplied to an output, controller 2406, as well as to normal read controllers, 2411a, 2411b, 2411c, 2411d, and redundant read controllers, 2421a, 2421b, 2421c, 2421d, respectively.

The externally generated address signal AD is inputted to an area selector 2402 and a defective-area indicator 2403. An area selection signal ASL1 output from the area selector 2402 is supplied to the normal write controllers, 2410a, 2410b, 2410c, 2410d, and also to the normal read controllers, 2411a, 2411b, 2411c, 2411d. An area selection signal ASL2 output from the area selector 2402 is supplied to the redundant write controllers, 2420a, 2420b, 2420c, 2420d, and also to the redundant read controllers, 2421a, 2421b, 2421c, 2421d. Normal write control signals, NWR1, NWR2, NWR3, NWR4, output from the respective normal write controllers, 2410a, 2410b, 2410c, 2410d, are supplied to normal memory sections, 2412a, 2412b, 2412c, 2412d, respectively. Redundant write control signals, RWR1, RWR2, RWR3, RWR4, output from the respective redundant write controllers, 2420a, 2420b, 2420c, 2420d, are supplied to redundant memory sections, 2422a, 2422b, 2422c, 2422d, respectively. Normal read control signals, NRD1, NRD2, NRD3, NRD4, output from the respective normal read controllers, 2411a, 2411b, 2411c, 2411d, are supplied to the normal memory sections, 2412a, 2412b, 2412c, 2412d, respectively. Redundant read control signals, RRD1, RRD2, RRD3, RRD4, output from the respective redundant read controllers, 2421a, 2421b, 2421c, 2421d, are supplied to the redundant memory sections, 2422a, 2422b, 2422c, 2422d, respectively.

An error detection signal WRM output from each of the normal memory sections 2412a, 2412b, 2412c, and 2412d is supplied to a write-disable detector 2404. A counter reset signal CRE, a parity check signal PCK, and a check signal CHK, output from the control signal generator 2401, are all supplied to the write-disable detector 2404. A normal-circuit enable signal NEN output from the area selector 2402 is supplied to the write-disable detector 2404. A write-disable detection signal WRD output from the write-disable detector 2404 is supplied to the defective-area indicator 2403. An operation destination select signal OSL output from the defective-area indicator 2403 is supplied to the area selector 2402.

Data DAT1 is both input and output with respect to the normal memory sections 2412a, 2412b and redundant memory sections 2422a, 2422b, is outputted with respect to the write data buffers 2407a, 2407b and test pattern generator 2405, and is inputted with respect to the output controller 2406. Similarly, data DAT2 is both inputted and outputted with respect to the normal memory sections 2412c, 2412d and redundant memory sections 2422c, 2422d, is outputted with respect to the write data buffers 2407c, 2407d and test pattern generator 2405, and is inputted with respect to the output controller 2406. External data EDT is inputted with respect to the write data buffers 2407a, 2407b, 2407c, 2407d, and is outputted with respect to the output controller 2406.

The operation of the above-configured memory device will be described below.

Figure 25A:
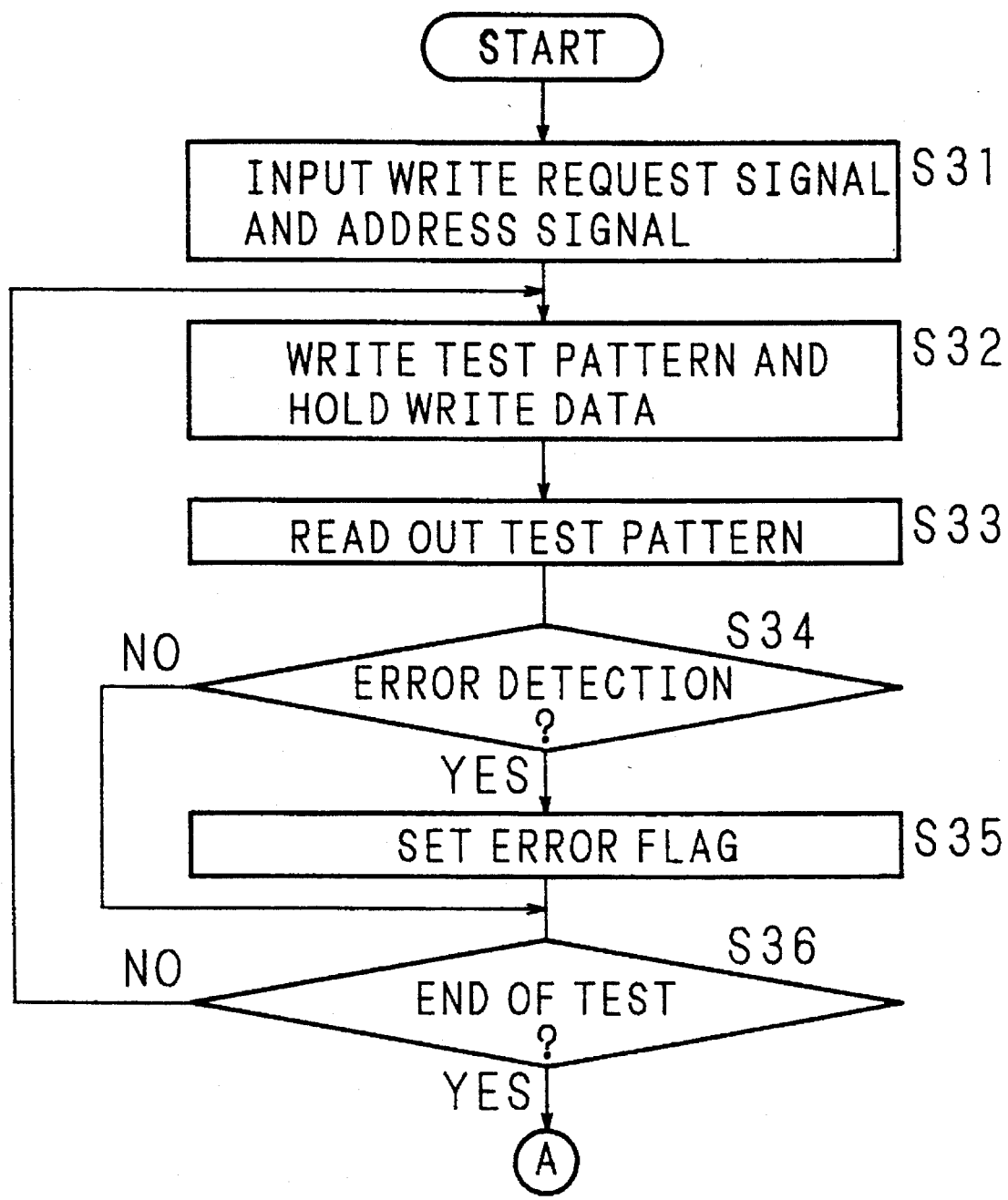
FIG. 25A and 25B are a flowchart for a write operation.
Figure 25B:
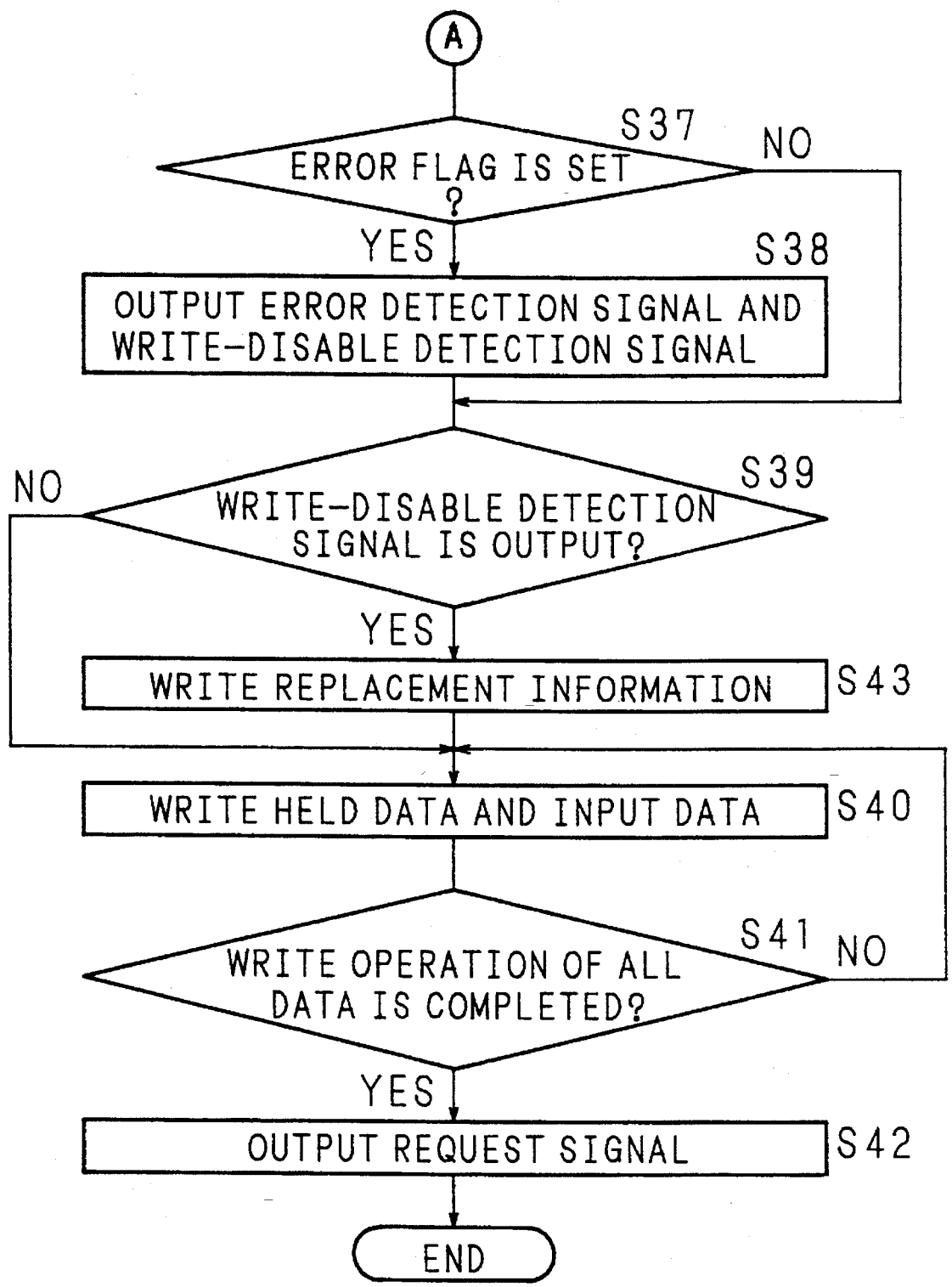
Figure 26:
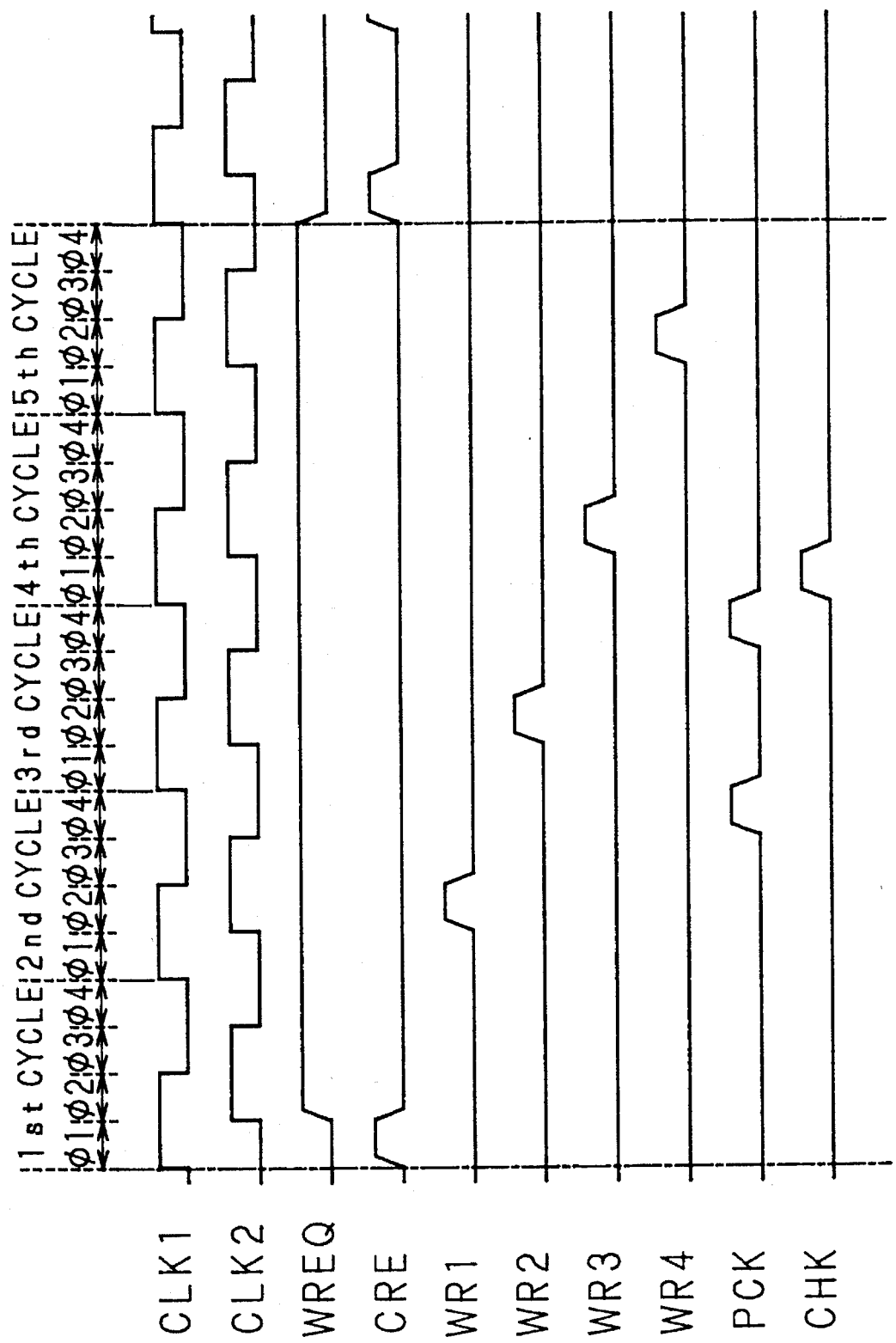
FIG. 26 is a timing chart for a write operation by the control signal generator.
Figure 27:
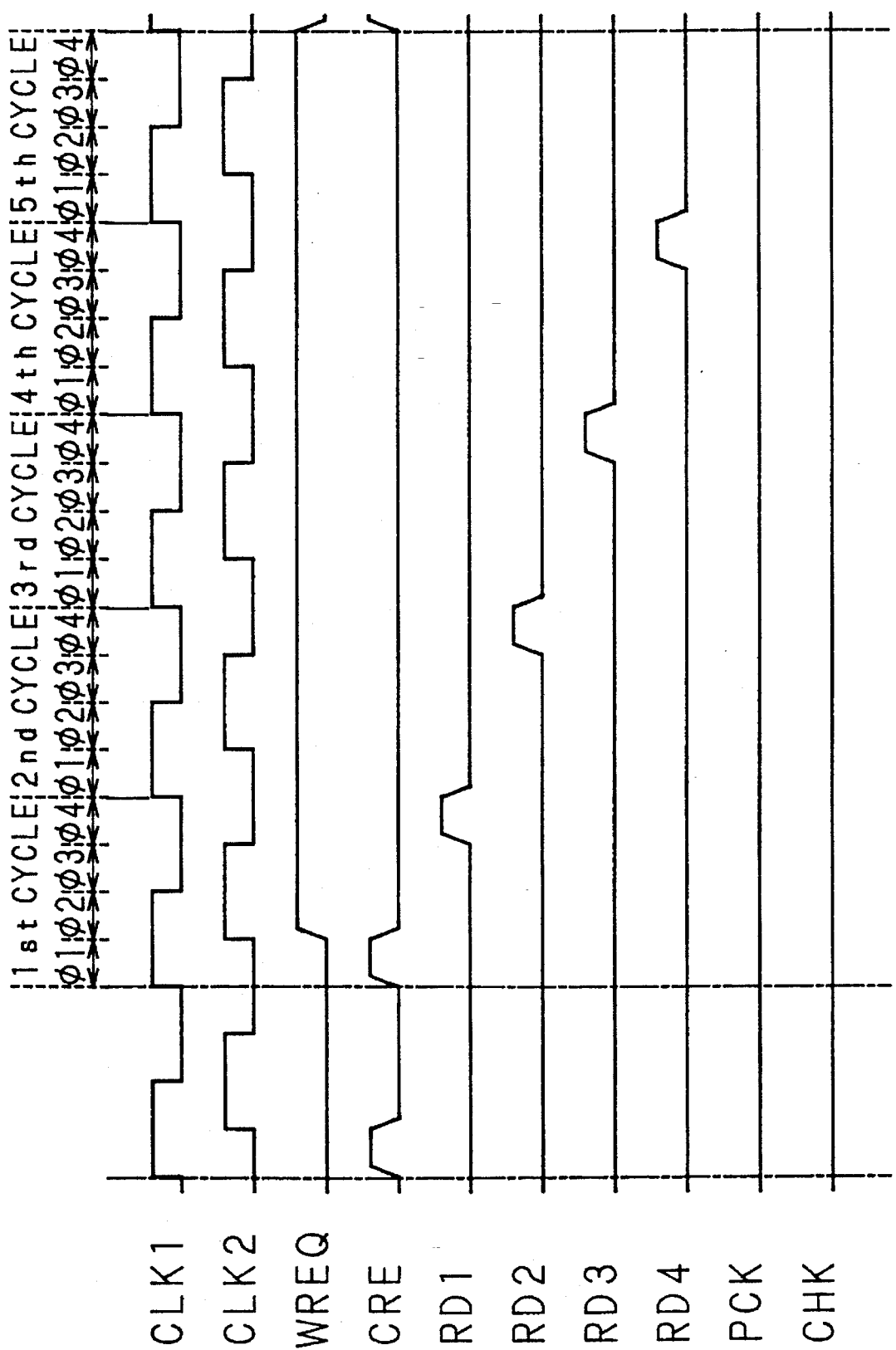
FIG. 27 is a timing chart for a read operation by the control signal generator.

The operation of the memory device is classified into two modes, a write operation and a read operation. FIG. 25 shows a flowchart for the write operation, and FIG. 26 shows a timing chart for the write operation. The flowchart for the read operation is identical to that shown in FIG. 3, except that in step S23, S24 in FIG. 3, data read is performed four times in the memory device of this embodiment. The timing chart for the read operation in this embodiment is shown in FIG. 27.

First, in the write operation, when the write request signal WREQ is asserted and the address signal AD is inputted (S31), the write signal WR1 is asserted with the timing of φ2 in the second cycle, and first word data is written and held in the write data buffer 2407a. With the same timing, a first test pattern generated by the test pattern generator 2405 is written into the normal memory sections 2412a, 2412b, 2412c, 2412d designated by the address signal AD (S32).

With the timing of φ4 in the second cycle, the parity check signal PCK is asserted, whereupon the test pattern written in the normal memory sections 2412a, 2412b, 2412c, 2412d is read out, (S33), and a parity check is performed to determine whether any discrepancy is detected between the test pattern previously written and the test pattern just read out (S34). If it is determined that a discrepancy is detected, an error flag is set (S35).

Next, a decision is made as to whether a predetermined number of tests have been completed to check the normal memory sections (S36). If the testing is not completed yet, the write signal WR2 is asserted with the timing of φ2 in the third cycle, and second data word is latched into the write data buffer 2407b, in the same manner as described above. With the same timing, a second test pattern generated by the test pattern generator 2405 is written into the normal memory sections 2412a, 2412b, 2412c, 2412d designated by the address signal AD. With the timing of φ4 in the third cycle, the parity check signal PCK is asserted, whereupon a parity check is performed on the test pattern written in the normal memory sections 2412a, 2412b, 2412c, 2412d. In this case also, if a discrepancy is detected, an error flag is set.

When the predetermined number of tests have been completed on the normal memory sections, it is then checked whether an error flag is set (S37). If it is determined that an error flag is set, then the error detection signal WRM and the write-disable detection signal WRD are outputted. If it is determined that no error flags are set, neither the error detection signal WRM nor the write-disable detection signal WRD is outputted. With the timing of φ1 in the fourth cycle, the check signal CHK is asserted; at this time, if the error detection signal WRM representing the result of the parity check is in the asserted state, the write-disable detector 2404 outputs the write-disable detection signal WRD (S38).

Next, a decision is made as to whether the write-disable detection signal WRD is asserted; when it is decided that the signal WRD is not asserted (S39), it means that the normal memory sections 2412a, 2412b, 2412c, and 2412d are operating properly. Therefore, with the timing of φ2 in the fourth cycle when the write signal WR3 is asserted, the first word data held in the write data buffer 2407a and third word data input via the write data buffer 2407c are outputted as the data DAT1 and DAT2, respectively, which are then written into the normal memory sections 2412a and 2412c, respectively (S40). Then, a decision is made as to whether the writing of all write data has been completed (S41); if a decision is made that the writing is not complete yet, then, as mentioned above, with the timing of φ2 in the fifth cycle when the write signal WR4 is asserted, the second word data held in the write data buffer 2407b and fourth word data input via the write data buffer 2407d are outputted as the data DAT1 and DAT2, respectively, which are then written into the normal memory sections 2412b and 2412d, respectively (S40). When it is decided that the writing of all write data has been completed, the request acknowledge signal ACK is output (S42) to complete the write operation.

On the other hand, if a decision is made that the write-disable detection signal WRD is asserted (S39), it means that the normal memory sections 2412a, 2412b, 2412c, and 2412d are not operating properly; therefore, replacement information is written into the defective-area indicator 2403 (S43) for the operation destination to be switched to the redundant memory sections 2422a, 2422b, 2422c, and 2422d. Then, with the timing of φ2 in the fourth cycle when the write signal WR3 is asserted, the first word data held in the write data buffer 2407a and third word data input via the write data buffer 2407c are outputted as the data DAT1 and DAT2, respectively, which are then written into the redundant memory sections 2422a and 2422c, respectively (S40). Then, a decision is made as to whether the writing of all write data has been completed (S41); if the writing is not complete yet, then, as mentioned above, with the timing of φ2 in the fifth cycle when the write signal WR4 is asserted, the second word data held in the write data buffer 2407b and fourth word data input via the write data buffer 2407d are outputted as the data DAT1 and DAT2, respectively, which are then written into the redundant memory sections 2422b and 2422d, respectively (S40). Thereafter, when it is decided that the writing of all write data has been completed, the request acknowledge signal ACK is outputted (S42) to complete the write operation.

The read operation will now be described below with reference to the flowchart of FIG. 3 in conjunction with the timing chart of FIG. 27. First, the read request signal RREQ is asserted (S20), and at the same time, the address signal AD is inputted, in response to which the defective-area indicator 2403 outputs the operation destination select signal OSL which carries information on the replacement of the normal memory sections (S21). When this operation destination select signal OSL indicates the normal memory sections 2412a, 2412b, 2412c, 2412d as the operation destination, that is, when a decision is made that the normal memory sections are valid, the read signal RD1 is asserted with the timing of φ4 in the first cycle, whereupon the first word data of the value held in the storage area within the normal memory section 2412a designated by the address signal AD is outputted as the data signal DAT1. Likewise, with the timing of φ4 in the second, third, and fourth cycles, the read signals RD2, RD3, and RD4 are respectively asserted, whereupon the values stored in the normal memory sections 2412b, 2412c, and 2412d designated by the address signal AD are respectively read out. Thereafter, the request acknowledge signal ACK is output (S25) to complete the read operation.

On the other hand, when the operation destination select signal OSL indicates the redundant memory sections 2422a, 2422b, 2422c, 2422d as the operation destination, that is, when a decision is made that the normal memory sections are invalid (S22), the read signal RD1 is asserted with the timing of φ4 in the first cycle, whereupon the first word data of the value held in the storage area within the redundant memory section 2422a designated by the address signal AD is outputted as the data DAT. Likewise, when the read signals RD2, RD3, and RD4 are asserted in the second, third, and fourth cycles, respectively, the values stored in the normal redundant sections 2422b, 2422c, and 2422d designated by the address signal AD are respectively read out. Thereafter, the request acknowledge signal ACK is outputted (S25) to complete the read operation.

In the read operation, each word data output from the normal memory sections 2412a, 2412b, 2412c, 2412d or the redundant memory sections 2422a, 2422b, 2422c, 2422d is outputted via the output controller 2406 as the external data EDT.

Thus, according to the above memory device, data to be written is temporarily stored in a write data buffer, and in the first half of a write operation cycle, the data initially written is compared with the readout result of that data to determine whether there is a discrepancy between them. If a discrepancy is detected, the data write destination is switched to the redundant memory sections; if not, the destination is switched to the normal memory sections. Then, in the second half of the write operation cycle, the data held in the write data buffer and the data to be written are written in simultaneously. This achieves correct and high-speed data write even if there exists a defective write area.

Further, as in the first embodiment, the second embodiment does not require the use of any special test equipment or processing equipment for switching the destination between the normal memory and redundant memory sections, and allows the initiation of a normal write operation upon starting the memory operation. Furthermore, since the memory sections are checked at the time of data write, proper action can be taken in case of a failure during the write operation. Moreover, since data read is performed immediately after data write, a failure analysis can be easily done to determine whether or not the failure caused is attributable to the data storing operation.

Next, the configuration and operation of each part shown in FIG. 24 will be described below.

Figure 28:
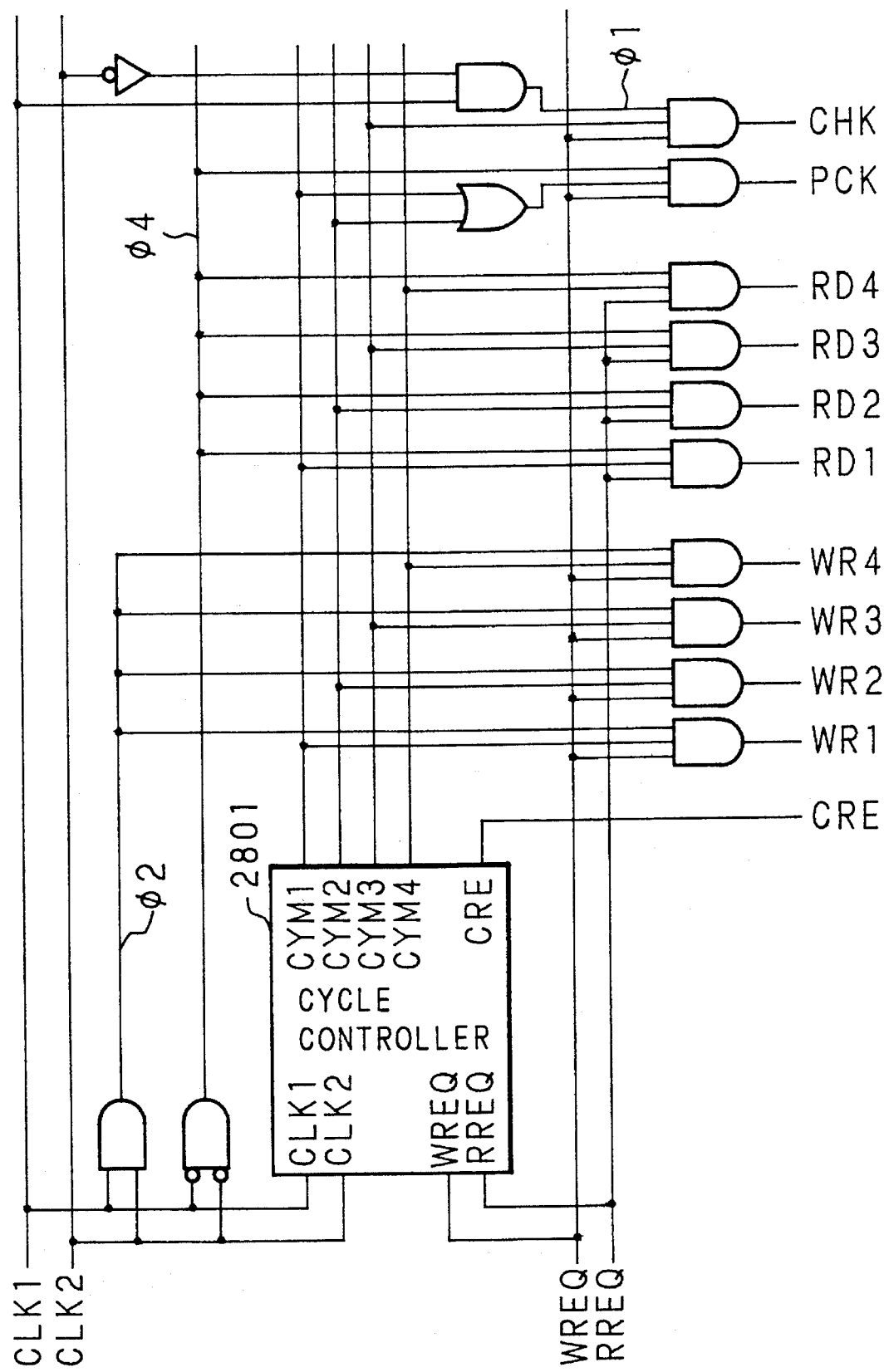
FIG. 28 is a block diagram showing a configuration of the control signal generator.

FIG. 28 is a block diagram showing the configuration of the control signal generator 2401. The write signals WR1, WR2, WR3, and WR4 are asserted with the timing of φ2 in the respective cycles during which the write request signal WREQ is asserted and respective cycle master signals CYM1, CYM2, CYM3, and CYM4 output from a cycle controller 2801 are asserted. The read signals RD1, RD2, RD3, and RD4 are asserted, with the timing of φ4 in the respective cycles during which the read request signal RREQ is asserted and the respective cycle master signals CYM1, CYM2, CYM3, and CYM4 are asserted. The parity check signal PCK is asserted with the timing of φ1 when the write request signal WREQ asserted and the cycle master signal CYM1 or CYM2 is in the asserted state. The check signal CHK is asserted with the timing of φ1 during which the write request signal WREQ and the cycle master signal CYM3 are asserted.

Figure 29:
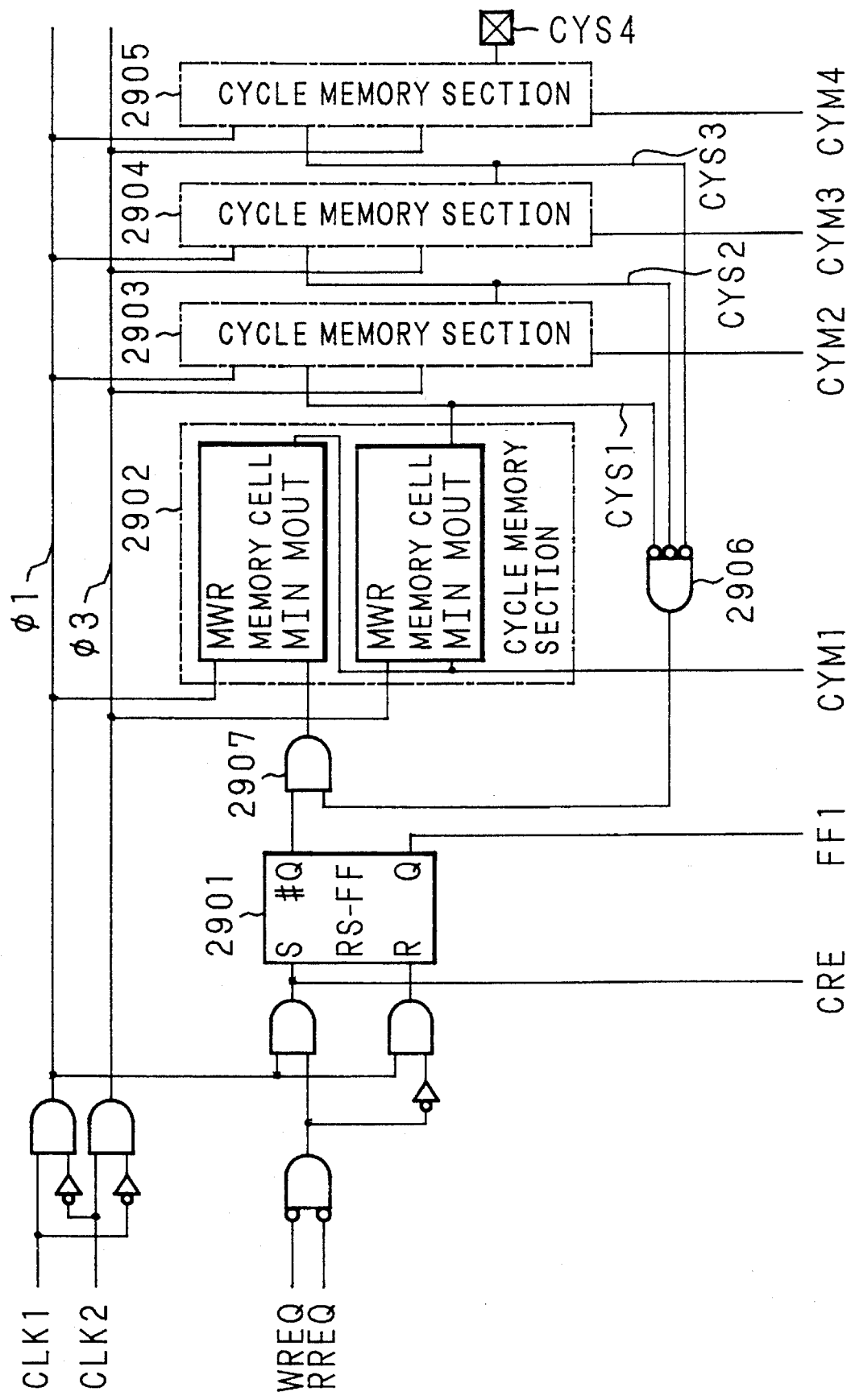
FIG. 29 is a block diagram showing a configuration of a cycle controller.
Figure 30:
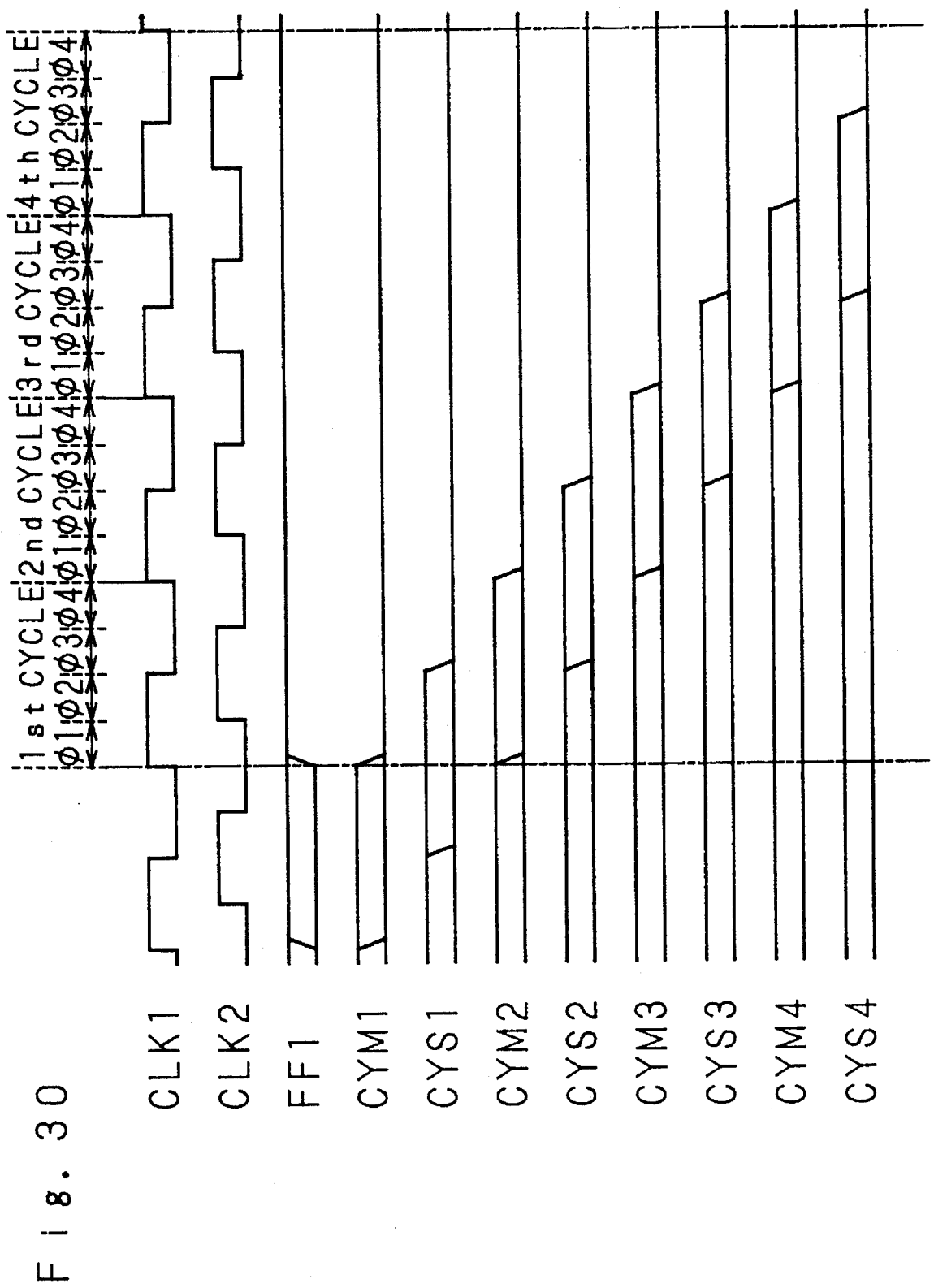
FIG. 30 is a timing chart for a reset operation.
Figure 31:
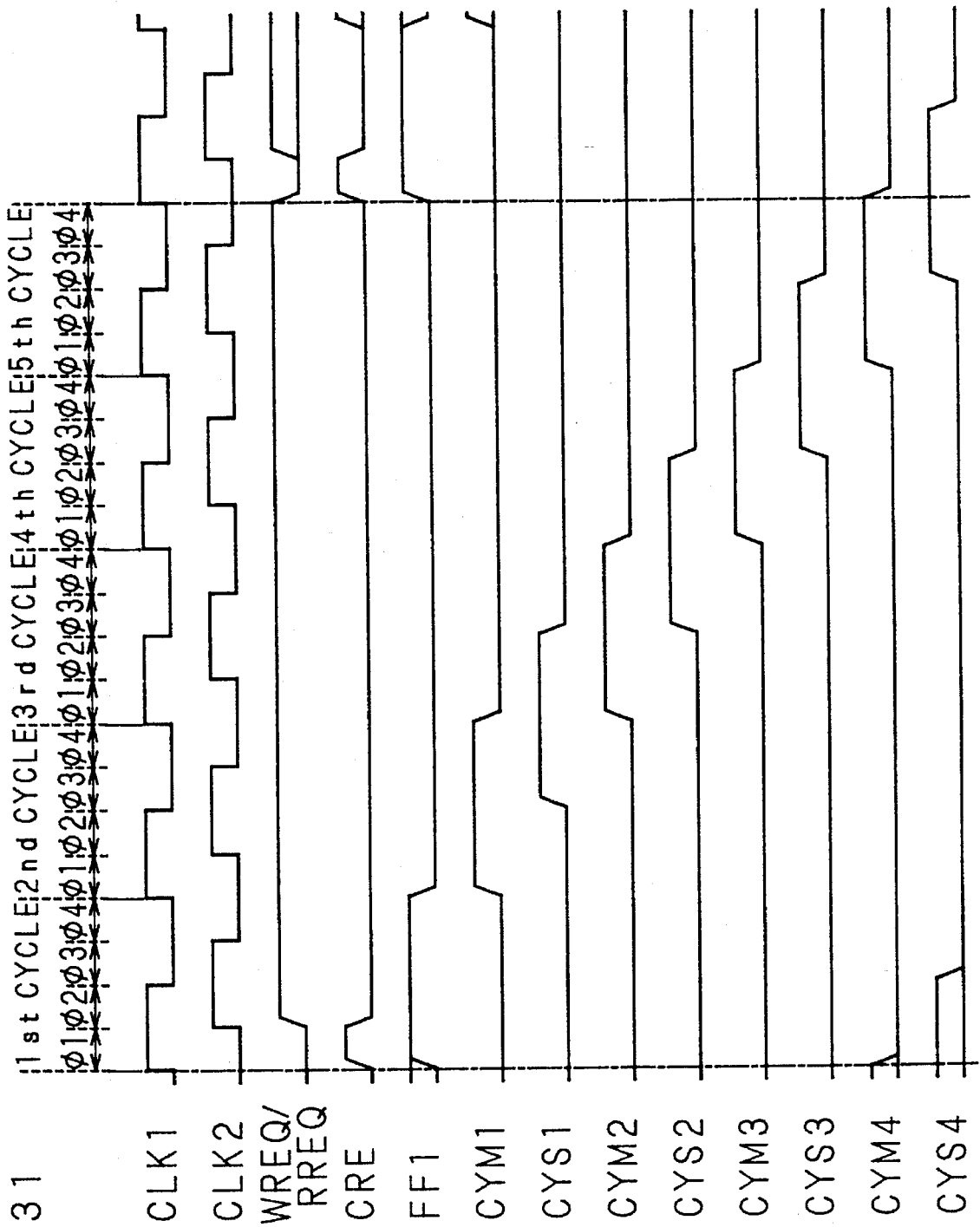
FIG. 31 is a timing chart for a normal operation.

FIG. 29 is a block diagram showing the configuration of the cycle controller 2801. The cycle controller 2801 operates in two modes, a reset operation and a normal operation. The reset operation will be first described with reference to FIGS. 30 and 31 which show the timing charts for the various signals.

At reset, the write request signal WREQ and the read request, signal RREQ are both negated, and an output signal FF1 of an RS-FF 2901 is set with the timing of φ1. This causes an AND circuit 2907 to output an L level signal which is then inputted to a cycle memory section 2902. The cycle memory section 2902 has a master-slave configuration constructed with memory cells of the same configuration as that shown in FIG. 17, and signals are sequentially transferred with the timings of φ1 and φ3. Therefore, the outputs of the masters in the cycle memory sections 2902, 2903, 2904, and 2905, i.e. the cycle master signals CYM1, CYM2, CYM3, and CYM4, are sequentially reset with the timing of φ1 or φ3 in the respective cycles. When the state in which neither the write request signal WREQ nor the read request signal RREQ is asserted continues for four or more cycles, the cycle master signals CYM1, CYM2, CYM3, and CYM4 will have been all reset, thus completing the reset operation.

The operation in the normal mode will be described below. With the write request signal WREQ and the read request signal RREQ both negated, the counter reset signal CRE is asserted with the timing of φ1. That is, by controlling the timing so that the write request signal WREQ or the read request signal RREQ is asserted with the timing of φ2, the counter reset signal CRE is always outputted upon initiation of a write or a read operation.

The counter reset signal CRE is also applied to a set terminal S of the RS-FF 2901. In situations where either the write request signal WREQ or the read request signal RREQ is asserted, a signal asserted with the timing of φ1 is supplied to a reset terminal R of the RS-FF 2901. That is, the output of the RS-FF 2901 is asserted in the first cycle of the write or read operation, and negated in the second and later cycles.

Cycle slave signals CYS1, CYS2, and CYS3, which are outputted from the slaves in the cycle memory sections 2902, 2903, and 2904, are inputted to a NOR circuit 2906 whose output is supplied to the AND circuit 2907 along with an inverted output #Q of the RS-FF 2901. With the output of the AND circuit 2907 coupled to an input of the cycle memory section 2902, the cycle master signal CYM1 is asserted only during the second cycle period. By transferring the output of the cycle memory section 2902 to the cycle memory sections 2903, 2904, and 2905 in sequence, the cycle master signals CYM1, CYM2, CYM3, and CYM4, which are the cycle control signals for write and read operations, are generated.

The area selector 2402 shown in FIG. 24 is identical in configuration to the area selector illustrated in FIG. 7. The normal write controllers 2410a, 2410b, 2410c, 2410d, the normal read controllers 2411a, 2411b, 2411c, 2411d, the redundant write controllers 2420a, 2420b, 2420c, 2420d and the redundant read controllers 2421a, 2421b, 2421c, 2421d each have the same configuration as that shown in FIG. 8. Further, the defective-area indicator 2403 has the same configuration as that of the defective-area indicator shown in FIG. 13.

Figure 32:
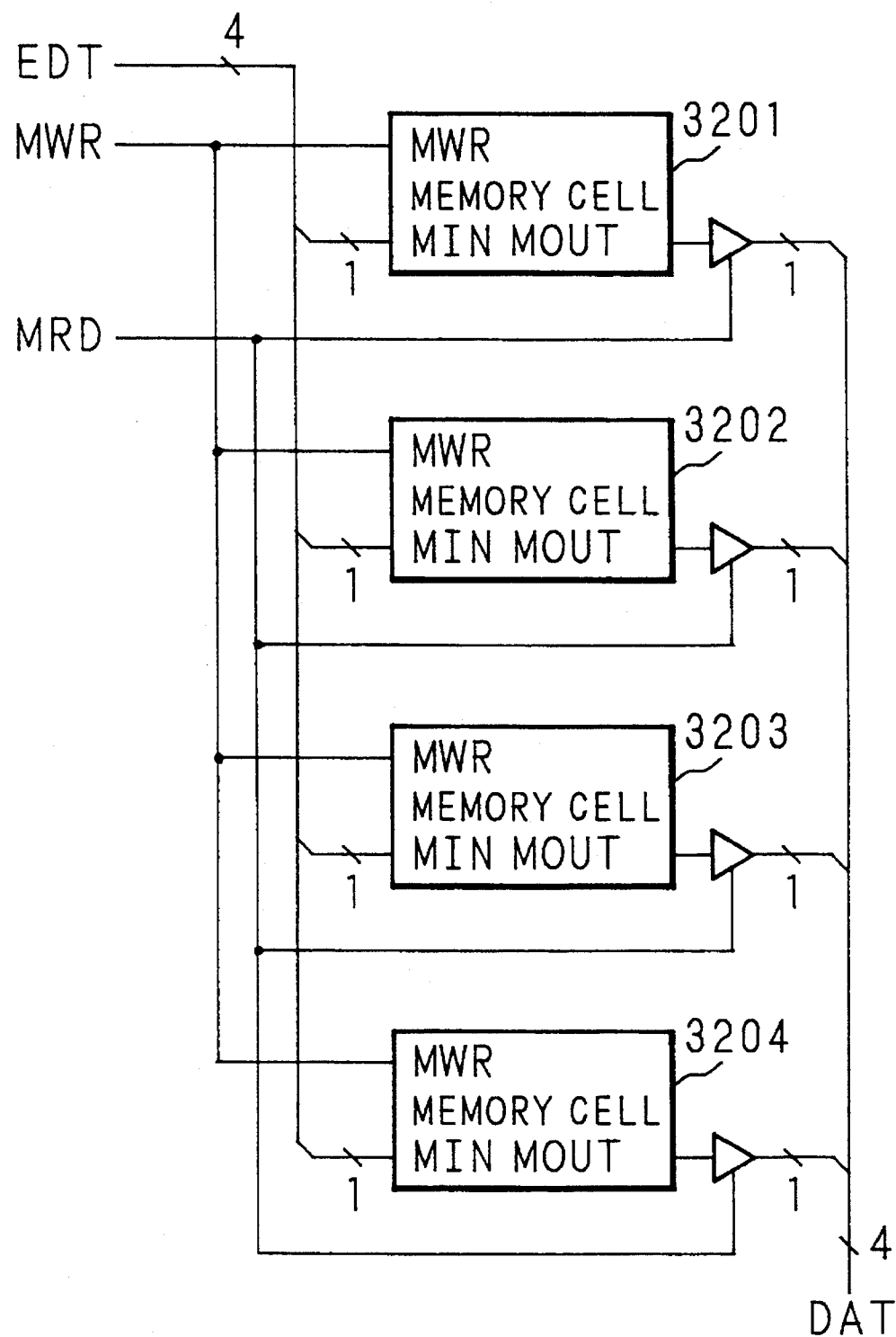
FIG. 32 is a block diagram showing a configuration of a write data buffer.

FIG. 32 is a block diagram showing the configuration of the write data buffer 2407a (2407b, 2407c, 2407d). Here, for the convenience of explanation, a parity check is performed for detection of errors in the normal circuit. For this purpose, each storage area in the normal memory sections 2412a, 2412b, 2412c, 2412d and the redundant memory sections 2422a, 2422b, 2422c, 2422d, which is accessed by the address signal AD, is provided with a circuit capable of holding four-bit data. Accordingly, the write data buffers 2407a, 2407b, 2407c, and 2407d are each provided with a four-bit data holding circuit, and the data DAT1 and DAT2 and the external data EDT each have a four-bit bus.

In the write data buffer 2407a, the external data EDT shown in FIG. 32 is coupled to the external data EDT shown in FIG. 24, the data DAT shown in FIG. 32 is coupled to the data DAT1 shown in FIG. 24, the memory cell write signal MWR shown in FIG. 32 is coupled to the write signal WR1 shown in FIG. 24, and the memory cell read signal MRD shown in FIG. 32 is coupled to the read signal WR3 shown in FIG. 24. In the write data buffer 2407b, the external data EDT shown in FIG. 32 is coupled to the external data EDT shown in FIG. 24, the data DAT shown in FIG. 32 is coupled to the data DAT1 shown in FIG. 24, the memory cell write signal NWR shown in FIG. 32 is coupled to the write signal WR2 shown in FIG. 24, and the memory cell read signal MRD shown in FIG. 32 is coupled to the read signal WR4 shown in FIG. 24. In the write data buffer 2407c, the external data EDT shown in FIG. 32 is coupled to the external data EDT shown in FIG. 24, the data DAT shown in FIG. 32 is coupled to the data DAT2 shown in FIG. 24, and the memory cell write signal NWR and memory cell read signal MRD shown in FIG. 32 are coupled to the write signal WR3 shown in FIG. 24. Further, in the write data buffer 2407d, the external data EDT shown in FIG. 32 is coupled to the external data EDT shown in FIG. 24, the data DAT shown in FIG. 32 is coupled to the data DAT2 shown in FIG. 24, and the memory cell write signal NWR and memory cell read signal MRD shown in FIG. 32 are coupled to the write signal WR4 shown in FIG. 24. The operation of each of the memory cells 3201, 3202, 3203, and 3204 is the same as that of the memory cell shown in FIG. 17.

First, when the write signal WR1 is asserted, the value of the external data EDT is latched into the data buffer 2407a. Next, when the write signal WR2 is asserted, the value of the external data EDT is latched into the write data buffer 2407b. When the write signal WR3 is asserted, the value of the external data EDT is latched into the write data buffer 2407c, and at the same time, the first word data and third word data held in the write data buffers 2407& and 2407c are outputted as the data DAT1 and DAT2, respectively. Next, when the write signal WR4 is asserted, the value of the external data EDT is latched into the write data buffer 2407d, and at the same time, the second word data and fourth word data held in the write data buffers 2407b and 2407d are outputted as the data DAT1 and DAT2, respectively.

Figure 33:
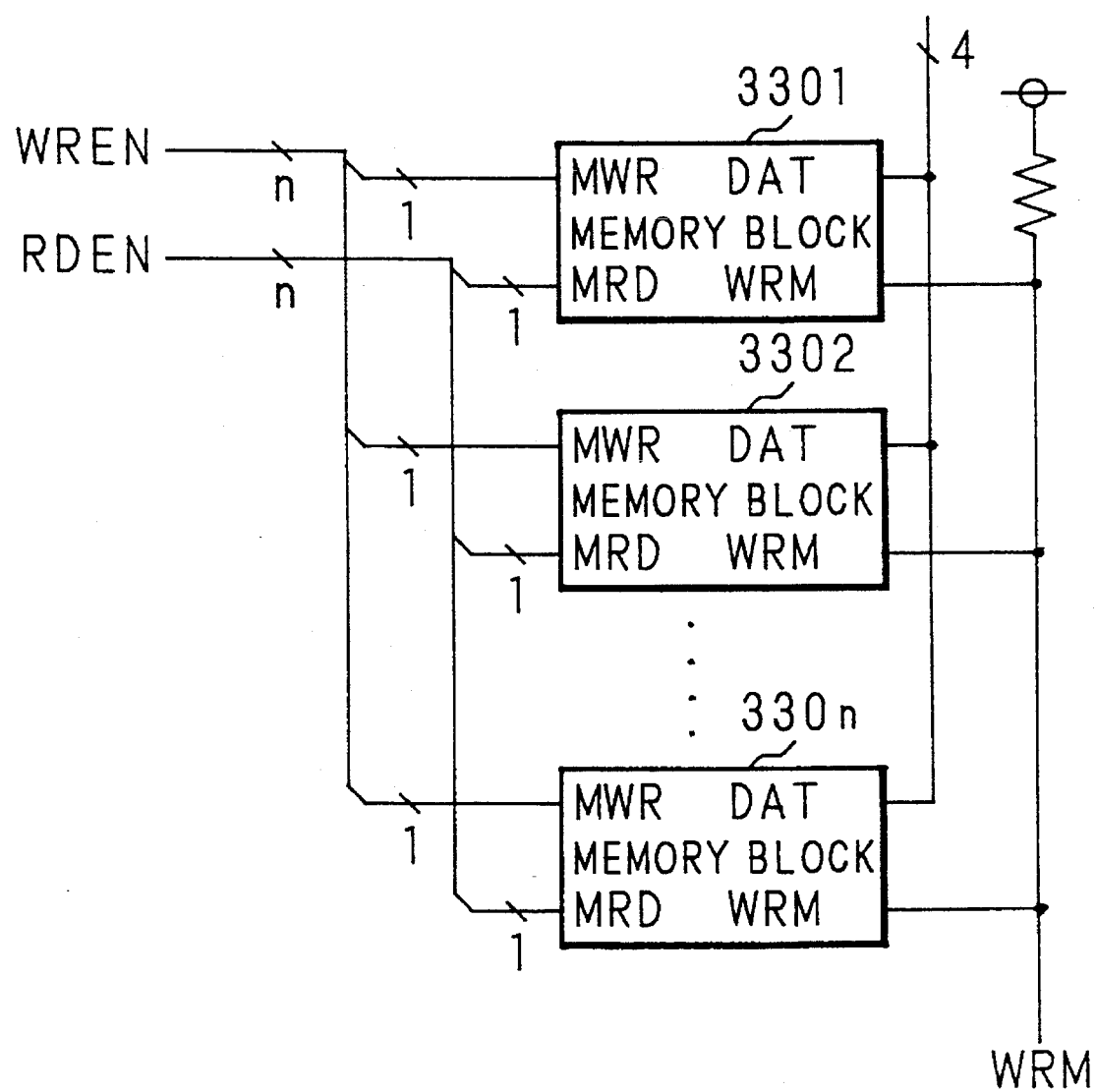
FIG. 33 is a block diagram showing a configuration of the normal memory section.
Figure 34:
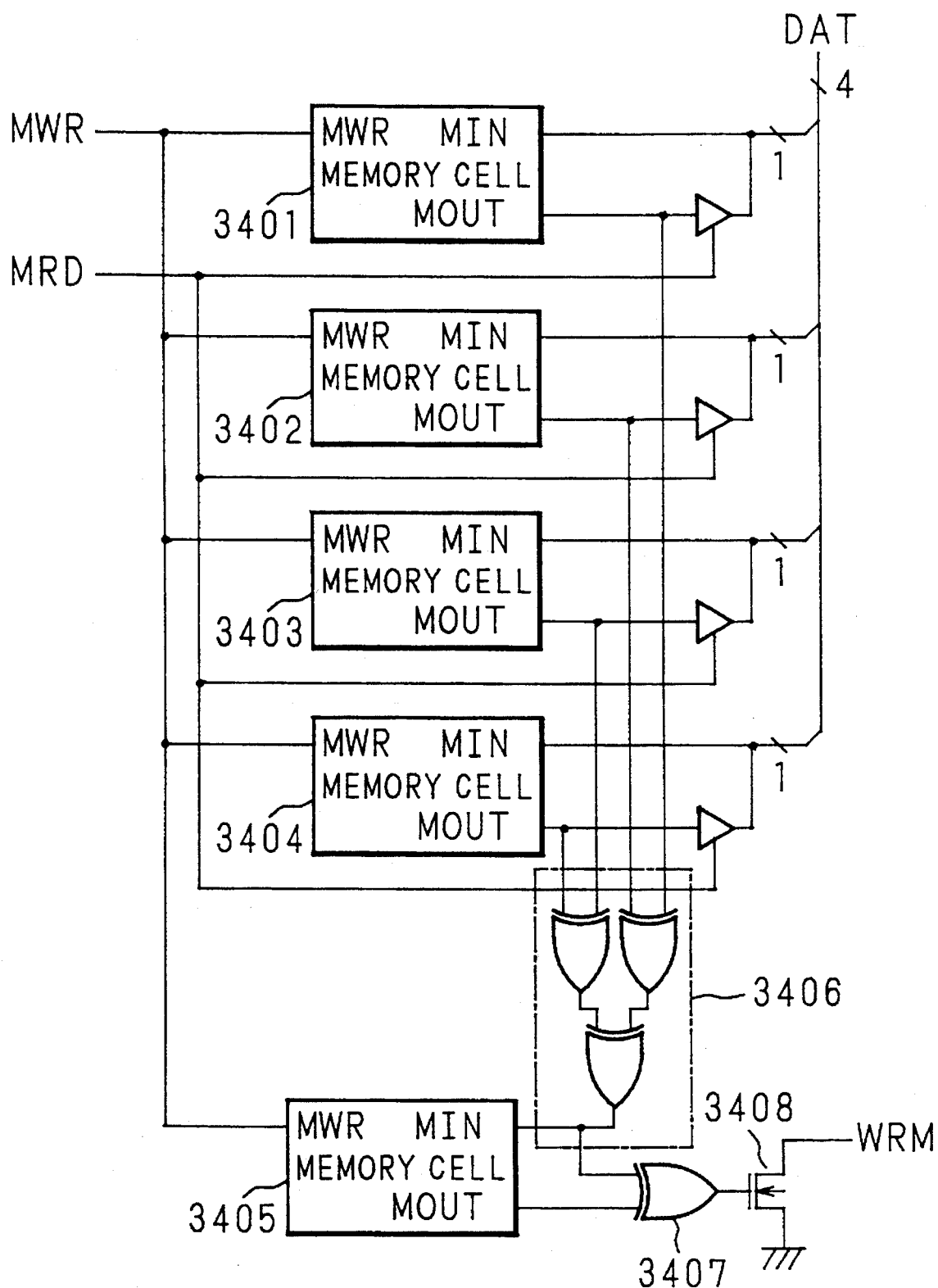
FIG. 34 is a block diagram showing a configuration of a memory block.

FIG. 33 is a block diagram showing the configuration of the normal memory section 2412a(2412b, 2412c, 2412d), and FIG. 34 is a block diagram showing the configuration of a memory block shown in FIG. 33. The normal memory sections 2412a, 2412b, 2412c, and 2412d are each divided into memory blocks 3301, 3302, ..., 330n each serving as a write area accessible by the address signal AD. As noted in the description of the write data buffers 2407a, 2407b, 2407c, and 2407d, each memory block has four one-bit memory cells 3401, 3402, 3403, and 3404, and also has a parity-bit memory cell 3405, a parity generating circuit 3406, and a parity check circuit 3407. Further, the memory cell write signal MWR shown in FIG. 34 is coupled to the normal write control signal NWR shown in FIG. 24, and the memory cell read signal MRD shown in FIG. 34 is coupled to the normal read control signal NRD shown in FIG. 24.

The operation of each of the memory cells 3401, 3402, 3403, and 3404 is the same as the memory cell shown in FIG. 17. The outputs of the memory cells 3401, 3402, 3403, and 3404 are always inputted to the parity generating circuit 3406. The parity bit generated by the parity generating circuit 3406 is latched into the parity-bit memory cell 3405 upon data write. Further, the value generated by the parity generating circuit 3406 is always compared by the parity check circuit 3407 with the value held in the parity-bit memory cell 3405. The state of a switching device 3408 changes according to the output of the parity check circuit 3407, and error detection signals WRM from the memory blocks 3301, 3302, ..., are wired-ORed to produce an overall error detection signal WRM.

Figure 35:
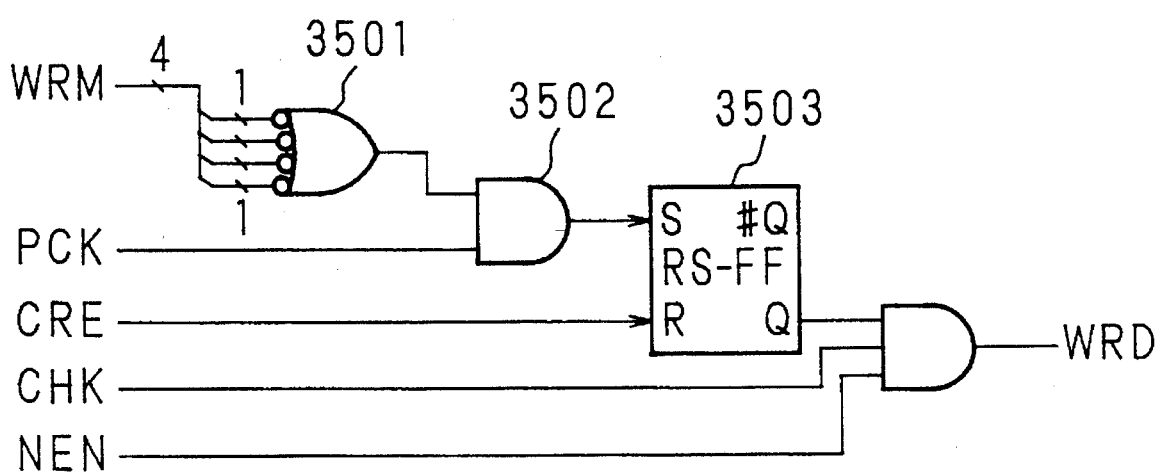
FIG. 35 is a block diagram showing a configuration of the write-disable detector.

FIG. 35 is a block diagram showing the configuration of the write-disable detector 2404. The error detection signal WRM for every word check is always inputted to a NAND circuit 3801 which then produces a combined check result. If the combined result indicates a write-disabled state, and if the parity check signal PCK is asserted, then an RS-FF 3503 is set by the output of an AND circuit 3502. To a reset terminal R of the RS-FF 3503 is supplied with the counter reset signal CRE, the reset always being done in the first cycle of a write operation. The write-disable signal WRD is outputted when the RS-FF 3503 is set, and the normal-circuit enable signal NEN directing the writing to the normal memory sections is asserted, with the check signal CHK being asserted.

The redundant memory sections 2422a, 2422b, 2422c, and 2422d are identical in configuration to the normal memory sections 2412a, 2412b, 2412c, and 2412d, except that the parity-bit memory cell 3405, parity generating circuit 3406, and parity check circuit 3407 shown in FIGS. 33 and 34 are eliminated in the redundant memory sections.

Figure 36:
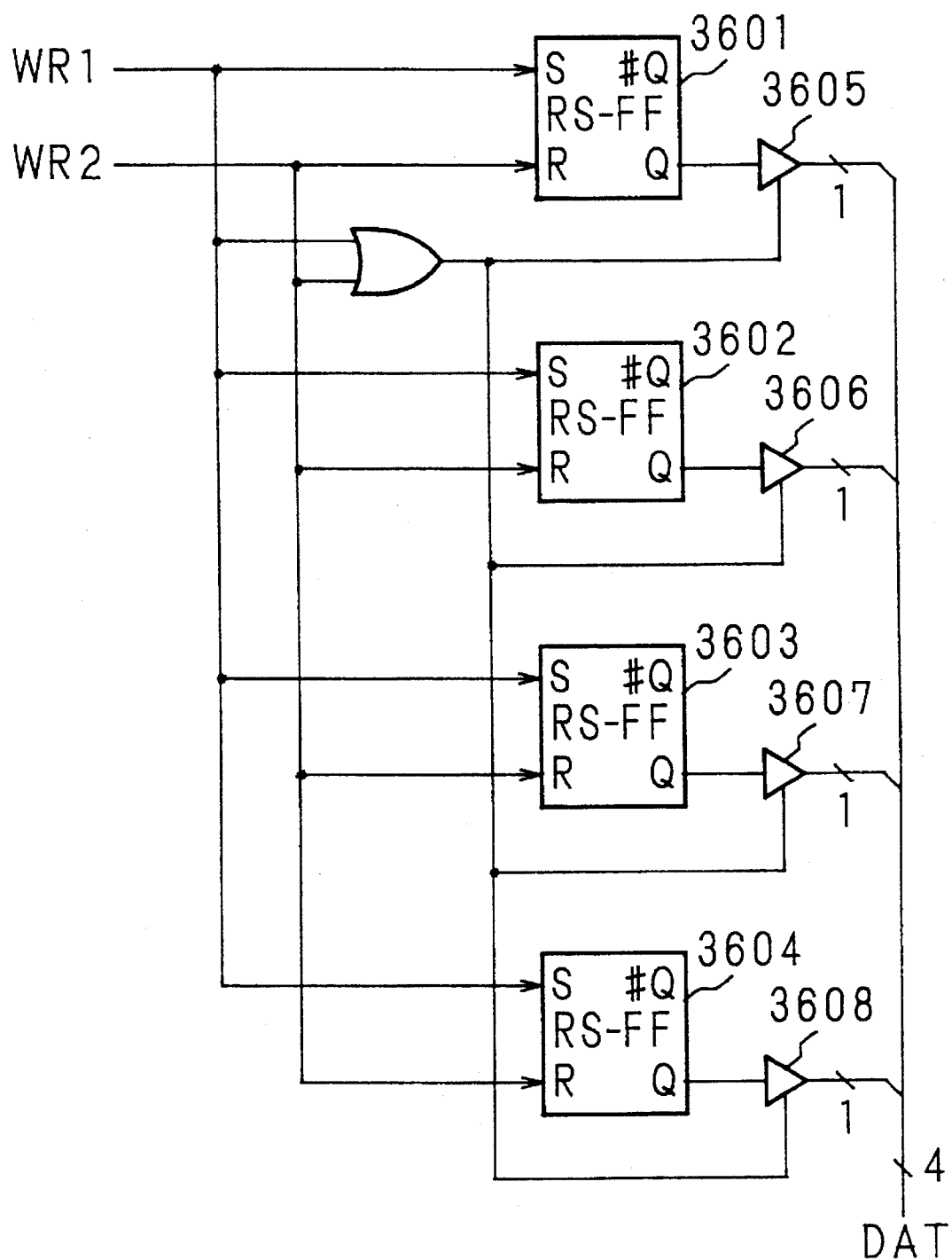
FIG. 36 is a block diagram showing a configuration of a test pattern generator.

FIG. 36 is a block diagram showing the configuration of the test pattern generator 2405. When the write signal WR1 is asserted, RS-FFs 3601, 3602, 3603, and 3604 are all reset. Also, when the write signal WR2 is asserted, the RSFFs 3601, 3602, 3603, and 3604 are all reset. Combinations of output Q or inverted output #Q of the RS-FFs 3601, 3602, 3603, and 3604 are selected and input to tri-state buffers 3605, 3606, 3607, and 3608, to produce a test pattern. The outputs of the tri-state buffers 3605, 3606, 3607, and 3608 are output as the data DAT1 and DAT2.

Figure 37:
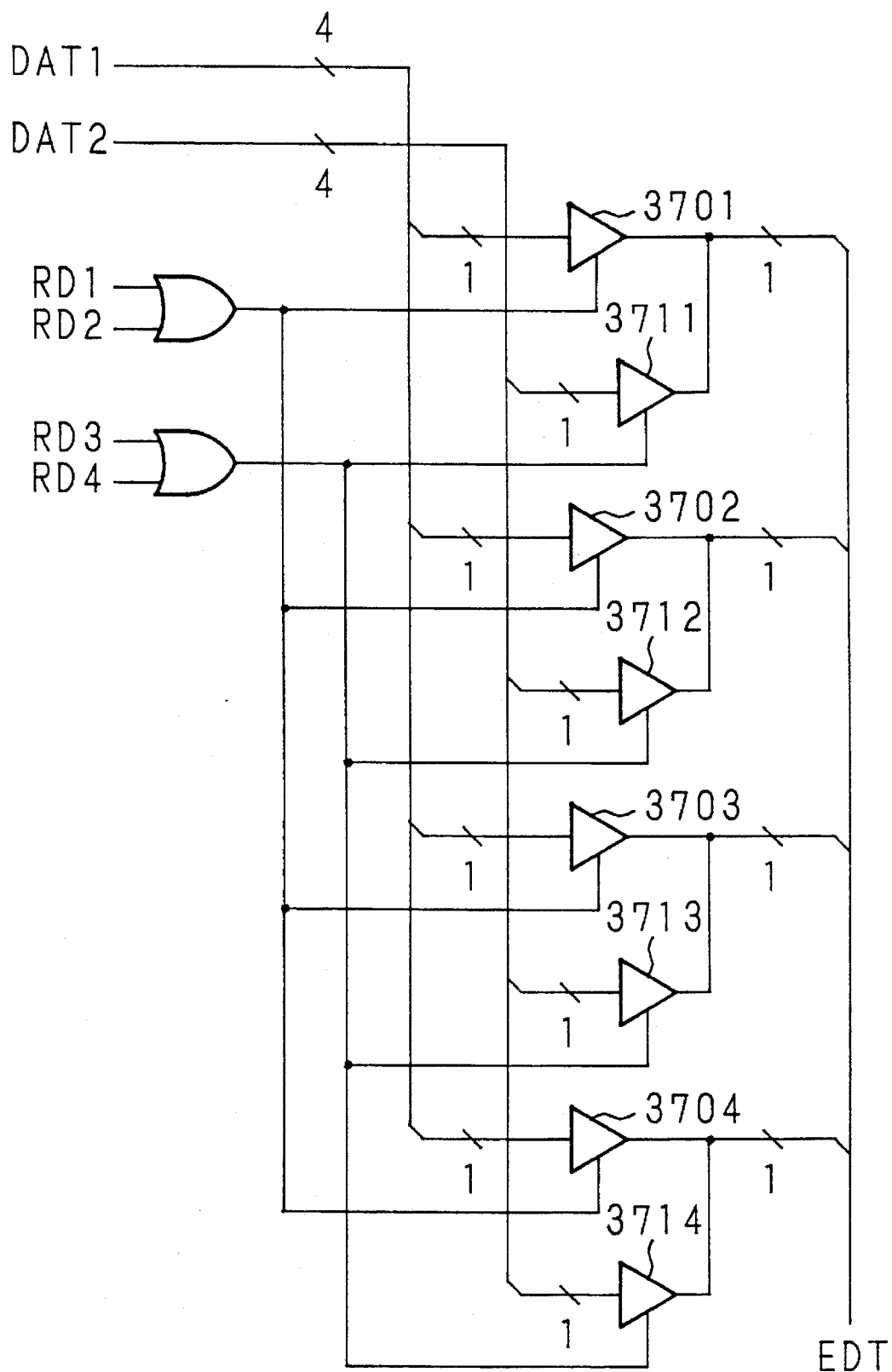
FIG. 37 is a block diagram showing a configuration of an output controller.

FIG. 37 is a block diagram showing the configuration of the output controller 2406. The operation of this controller will be described with reference to FIGS. 24 and 37. In FIG. 24, the data DAT1 is supplied to the normal memory sections 2412a, 2412b and redundant memory sections 2422a, 422b, while the data DAT2 is supplied to the normal memory sections 2412c, 2412d and redundant memory sections 2422c, 422d. That is, the first word data and the second word data are each supplied as the data DAT1, and the third word data and the fourth word data are each supplied as the data DAT2.

Therefore, in FIG. 37, when the read signal RD1 and RD2 are asserted, the value of the data DAT1 is outputted as the external data EDT via tri-state buffers 3701, 3702, 3703, and 3704, and when the read signal RD3 and RD4 are asserted, the value of the data DAT2 is outputted as the external data EDT via the tri-state buffers 3711, 3712, 3713, and 3714. As previously mentioned, the data DAT1, DAT2 and the external data EDT each have a four-bit data bus.

In the present embodiment, the write and read circuits are provided separately for the normal memory sections and redundant memory sections, but these circuits may be provided common to both memory sections. Also, the write data buffers may be eliminated by substituting the redundant memory sections. Furthermore, the present invention can be applied to a cache memory.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A memory device which contains data writing means, data holding means, and data reading means, and in which a destination area within said data holding means for access via said data writing means and said data reading means is specified by a prescribed signal and a plurality of data are written successively, said memory device comprising:

write-data holding means for temporarily holding data to be written into said data holding means;

error detecting means for detecting a discrepancy between the data obtained by the operation of said data reading means and the data initially written by said data writing means;

defective-area indicating means for indicating a defective area detected within said data holding means by said error detecting means;

alternate data-holding means having a function equivalent to that of said data holding means;

alternate data-writing means for writing data into said alternate data-holding means;

alternate data-reading means for reading data out, of said alternate data-holding means; and operation switching means for switching the destination of a write operation either to said data holding means or to said alternate data-holding means by said error detecting means and said defective-area indicating means;

wherein in the first-half period of a successive write operation, the data to be written is stored into said write-data holding means, and using a prescribed value, said data reading means performs a data read operation immediately after a data write operation by said data writing means, thereby detecting a defective area within said data holding means, and in the second-half period of the successive write operation, the destination of the write operation is switched either to said data holding means or to said alternate data-holding means in accordance with the indication given by said defective-area indicating means, and the data held in said write-data holding means is written together with the data to be written.

2. A memory device in which a plurality of data are successively written, comprising:

data holding means for holding data;

data writing means for writing data into said data holding means;

data reading means for reading data out of said data holding means;

write-data holding means for temporarily holding data to be written into said data holding means;

detecting means for detecting a defective area within said data holding means by detecting a discrepancy between the data obtained by the operation of said data reading means and the data initially written by said data writing means;

alternate data-holding means having a function equivalent to that of said data holding means;

alternate data-writing means for writing data into said alternate data-holding means;

alternate data-reading means for reading data out of said alternate data-holding means;

switching means for switching the destination of a write operation either to said data holding means or to said alternate data-holding means; and control means for performing control so that in the first-half period of a successive write operation, the data to be written is stored into said write-data holding means, and said data reading means performs a data read operation immediately after a data write operation by said data writing means, thereby detecting a defective area within said data holding means, and so that in the second-half period of the successive write operation, the destination of the write operation is switched either to said data holding means or to said alternate data-holding means, and the data held in said write-data holding means is written together with the data to be written.

3. A memory device in which a plurality of data are successively written, comprising:

first holding means for holding data;

first writing means for writing data into said first holding means;

first reading means for reading data out of said first holding means;

write-data holding means for temporarily holding data to be written into said first holding means during the first-half period of a successive write operation;

determining means for determining whether or not there is a defective area within said first holding means during the first-half period of the successive write operation by checking whether the data read out of said first holding means agrees with initially written data;

second holding means for holding data;

second writing means for writing data into said second holding means;

second reading means for reading data out of said second holding means; and switching means for switching the destination of the write operation from said first holding means to said second holding means during the second-half period of the successive write operation when said detecting means has determined that said first holding means contains a defective area.

4. A memory device according to claim 3, wherein in the second-half period of the successive write operation, when it is determined that said first holding means contains a defective area, the data held in said write-data holding means and the data to be written in the second-half period are written into said second holding means by said second writing means, and when it is determined that said first holding means contains no defective areas, the data held in said write-data holding means and the data to be written in the second-half period are written into said first holding means by said first writing means.

5. A memory device in which a plurality of data are successively written, comprising:

first holding means for holding data;

second holding means having a function equivalent to that of said first holding means;

writing means for writing data into said first and said second holding means;

reading means for reading data out of said first and said second holding means;

write-data holding means for temporarily holding data to be written into said first holding means during the first-half period of a successive write operation;

detecting means for detecting a defective area within said first, holding means during the first-half period of the successive write operation by detecting a discrepancy between the data obtained by the operation of said reading means and the data initially written by said writing means; and switching means for switching the destination of the write operation from said first holding means to said second holding means during the second-half of the successive write operation when said detecting means has detected a defective area within said first holding means.

* * * * *